(12) United States Patent
Miyamoto et al.

(10) Patent No.: US 7,102,221 B2
(45) Date of Patent: Sep. 5, 2006

(54) MEMORY-MODULE WITH AN INCREASED DENSITY FOR MOUNTING SEMICONDUCTOR CHIPS

(75) Inventors: Toshio Miyamoto, Kokubunji (JP); Asao Nishimura, Kokubunji (JP); Toshio Sugano, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 41 days.

(21) Appl. No.: 10/326,149

(22) Filed: Dec. 23, 2002

(65) Prior Publication Data

US 2003/0089978 A1    May 15, 2003

Related U.S. Application Data

(63) Continuation of application No. 09/499,618, filed on Feb. 7, 2000, now abandoned.

(30) Foreign Application Priority Data

Feb. 26, 1999  (JP)  ................................. 11-50292

(51) Int. Cl.
  *H01L 23/52*  (2006.01)
  *H01R 9/00*  (2006.01)
(52) U.S. Cl. .................. 257/690; 257/724; 257/738; 257/778; 257/E23.023; 361/774; 361/777
(58) Field of Classification Search ................ 257/678, 257/679, 681, 682, 723, 724, 735, 738, 773, 257/778–780, 784, 787; 228/180.21, 180.22; 438/108, 110–112, 127, 612–614; 361/772–774, 361/782, 783, 813
See application file for complete search history.

(56) References Cited

U.S. PATENT DOCUMENTS

| | | | |
|---|---|---|---|
| 4,774,635 A | * | 9/1988 | Greenberg et al. .......... 361/813 |
| 5,541,448 A | | 7/1996 | Carpenter |
| 5,604,379 A | * | 2/1997 | Mori .......................... 257/738 |
| 5,661,677 A | | 8/1997 | Rondeau, II et al. |
| 5,719,449 A | * | 2/1998 | Strauss ........................ 257/786 |
| 5,841,686 A | * | 11/1998 | Chu et al. ..................... 365/51 |
| 5,856,937 A | * | 1/1999 | Chu et al. ..................... 365/51 |
| 5,930,198 A | * | 7/1999 | Ryan ........................... 365/233 |
| 5,963,463 A | | 10/1999 | Rondeau, II et al. |
| 5,982,654 A | * | 11/1999 | Corisis ......................... 365/63 |
| 6,008,538 A | * | 12/1999 | Akram et al. ................ 257/723 |
| 6,069,793 A | | 5/2000 | Maruyama et al. |

(Continued)

FOREIGN PATENT DOCUMENTS

JP       1-258466       10/1989

(Continued)

*Primary Examiner*—Alonzo Chambliss
(74) *Attorney, Agent, or Firm*—Mattingly, Stanger, Malur & Brundidge, P.C.

(57) ABSTRACT

The invention is intended to increase the density for mounting the semiconductor chips on a memory-module, to increase the capacity of the memory-module, and to realize the memory-module capable of coping with high-speed buses. The memory-module comprises a plurality of WPPs having protruded terminals as external terminals and wiring portions for expanding the pitch among the protruded terminals to be wider than the pitch among the bonding electrodes of semiconductor chips, TSOPs having semiconductor chips, outer leads as external terminals, and are mounted via the outer leads that are electrically connected to the bonding electrodes of the semiconductor chips, and a module board supporting the WPPs and the TSOPs, wherein the WPPs and the TSOPs are mounted by the simultaneous reflowing in a mixed manner on the module board.

17 Claims, 27 Drawing Sheets

U.S. PATENT DOCUMENTS

| | | |
|---|---|---|
| 6,111,317 A * | 8/2000 | Okada et al. ............... 257/737 |
| 6,243,282 B1 | 6/2001 | Rondeau, II et al. |
| 6,256,217 B1 | 7/2001 | Rondeau, II et al. |
| 6,266,242 B1 | 7/2001 | Maruyama et al. |
| 6,288,924 B1 | 9/2001 | Sugano et al. |
| 6,307,769 B1 * | 10/2001 | Nuxoll et al. ............... 365/63 |
| 6,326,699 B1 | 12/2001 | Shimizu et al. |
| 6,347,394 B1 * | 2/2002 | Ochoa et al. ............... 716/6 |

FOREIGN PATENT DOCUMENTS

| | | |
|---|---|---|
| JP | 7-86492 | 3/1995 |
| JP | 10-209368 | 8/1998 |
| JP | 2000164792 | 6/2000 |

* cited by examiner

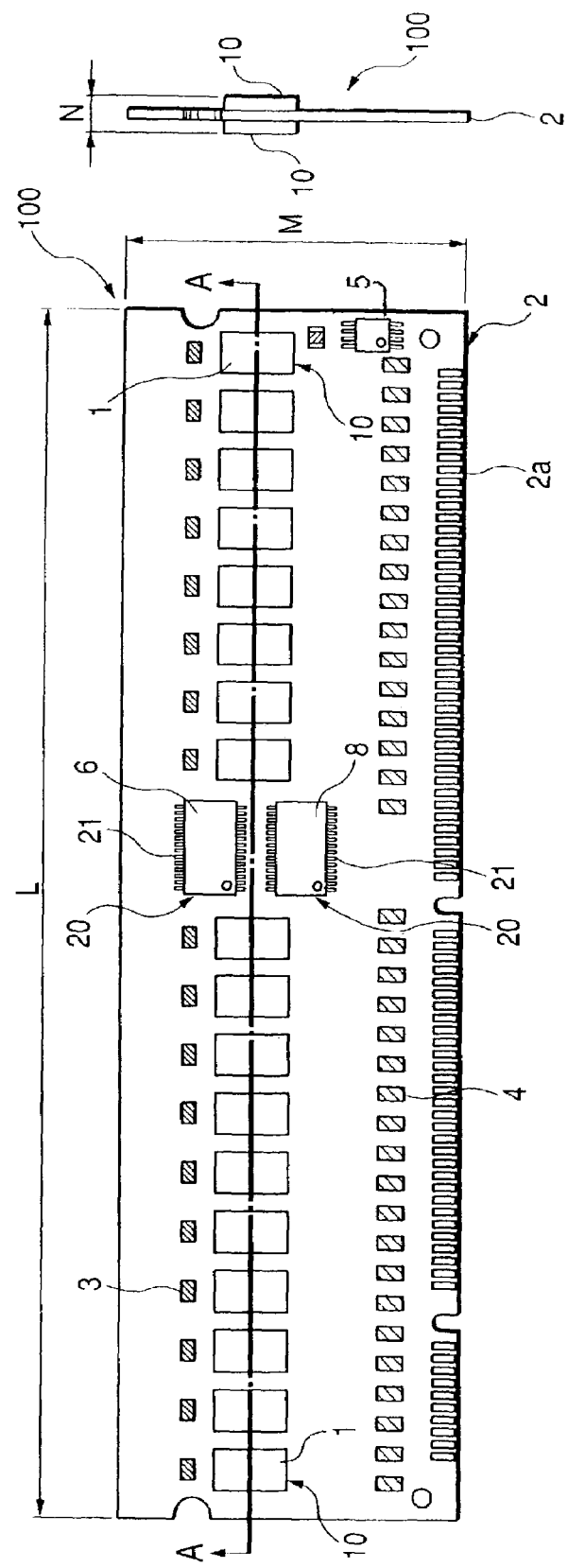
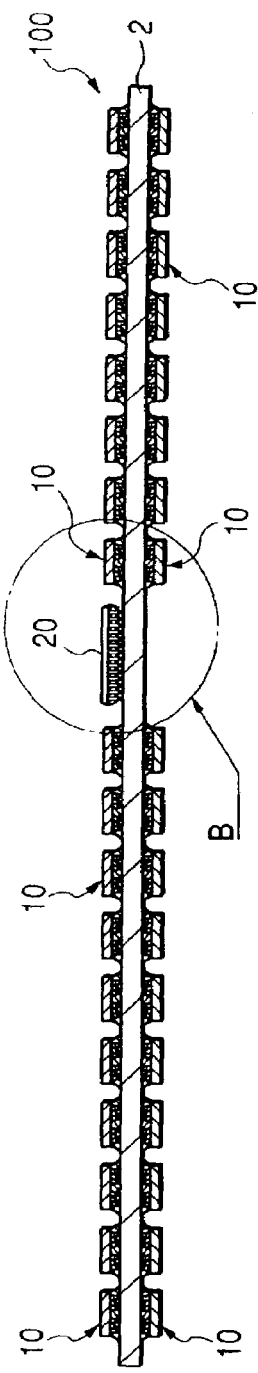
FIG. 1(a)
FIG. 1(b)
FIG. 1(c)

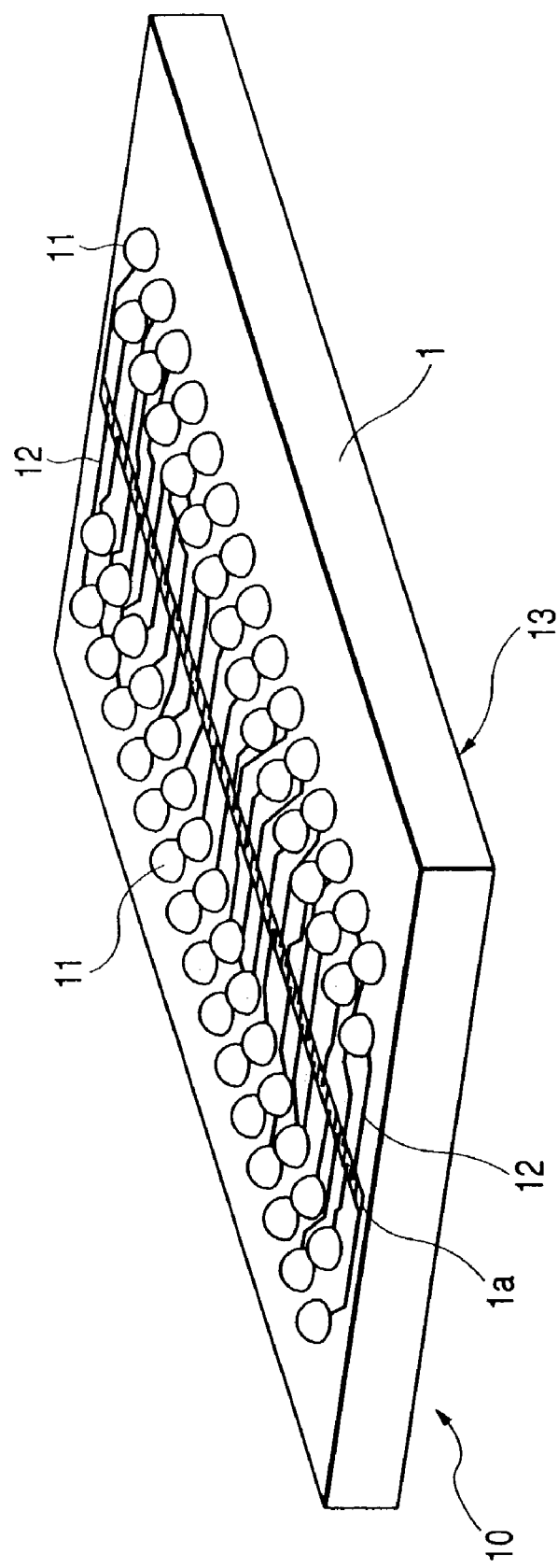

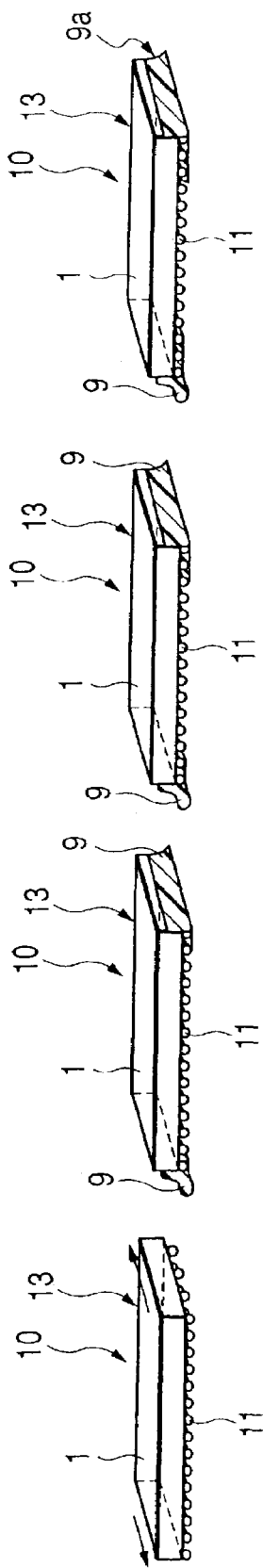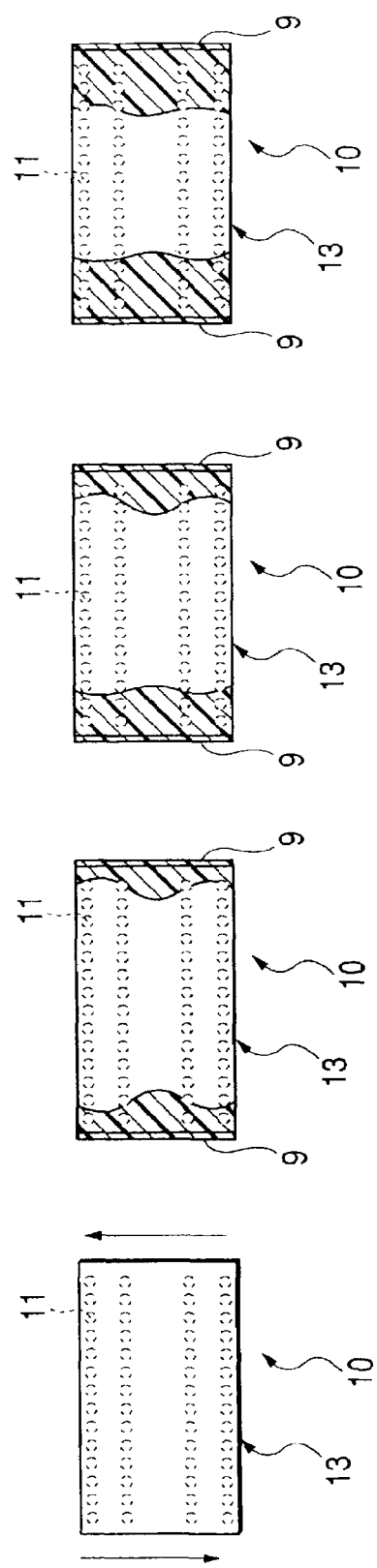

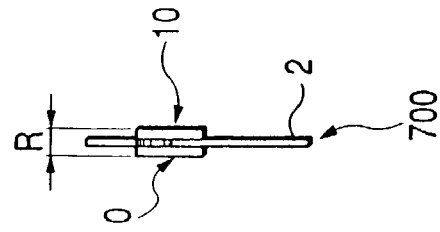
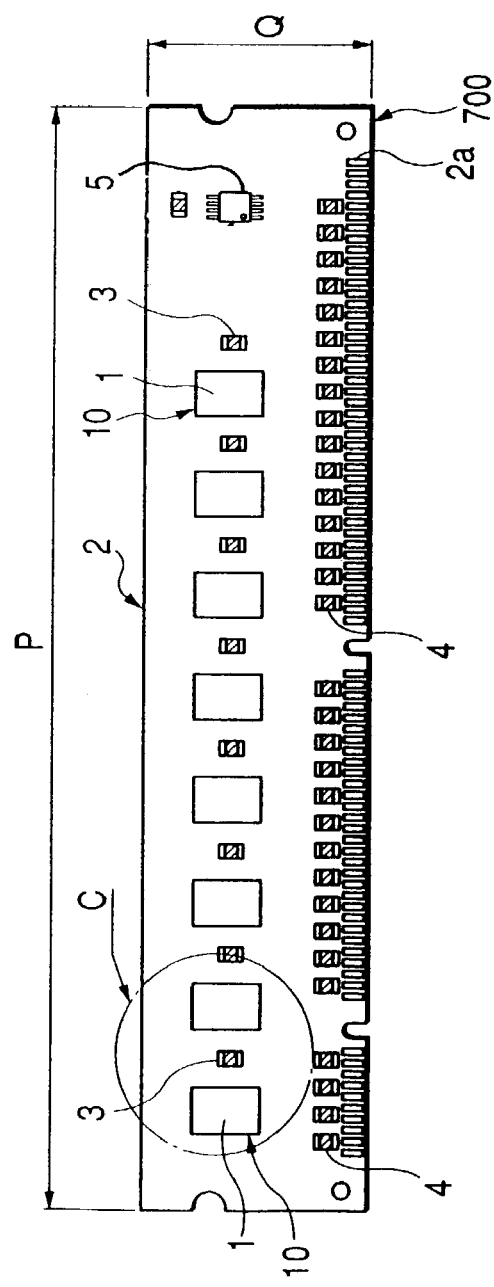

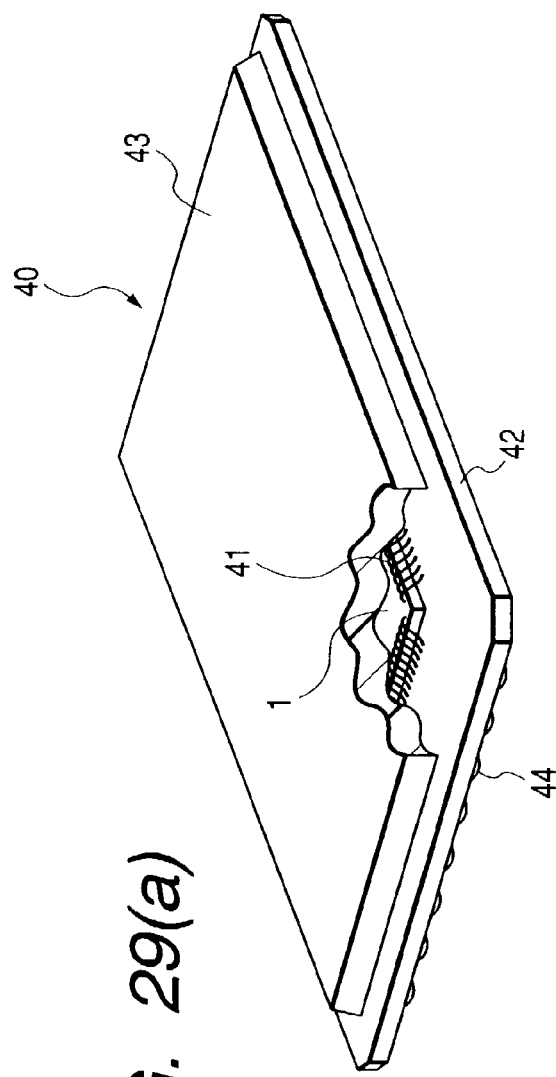
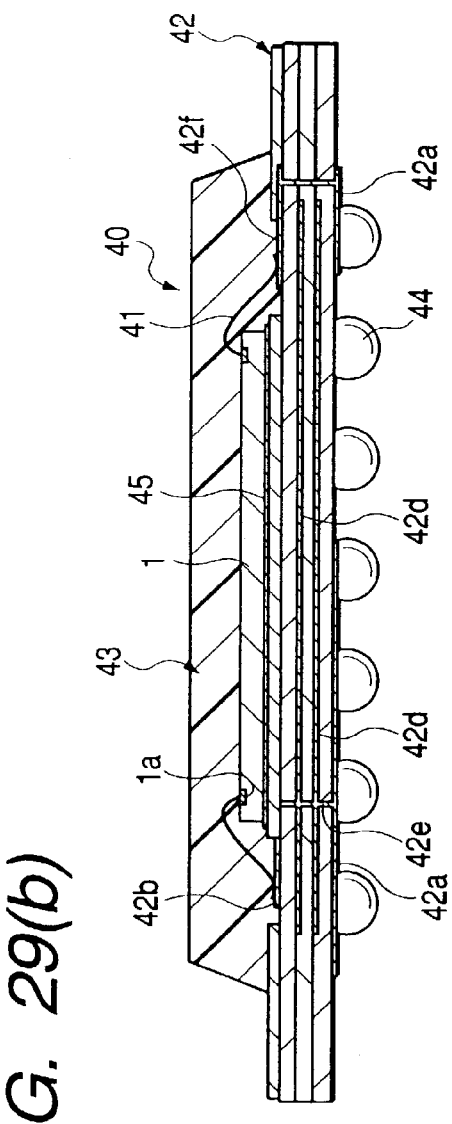
FIG. 29(a)
FIG. 29(b)

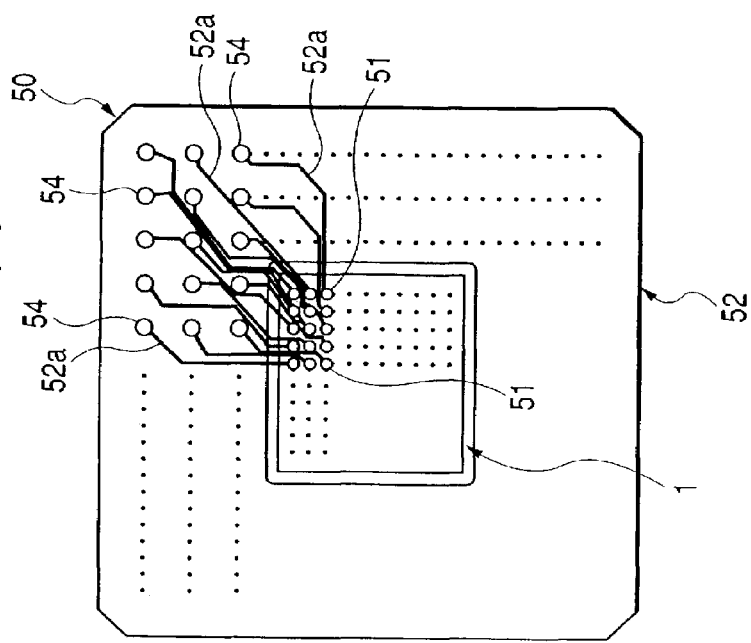
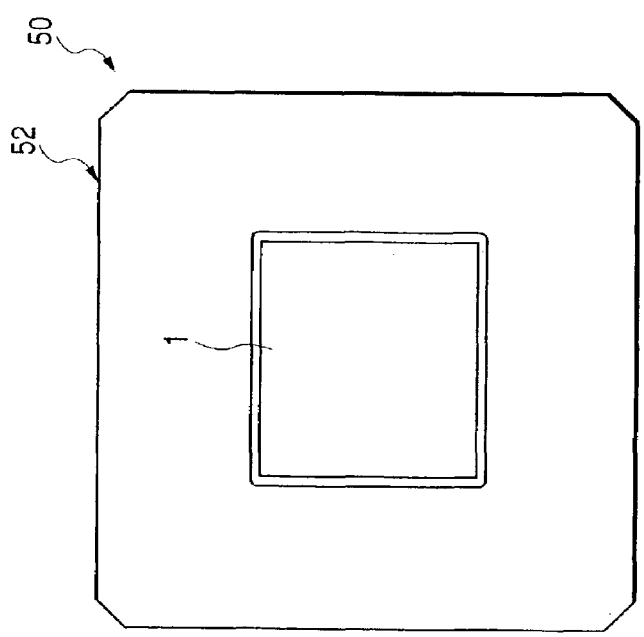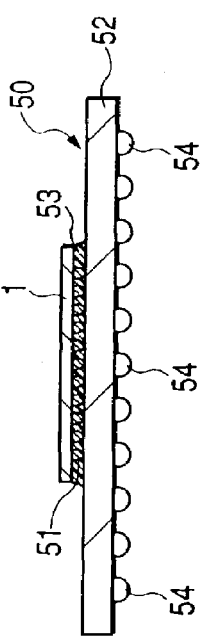

MEMORY-MODULE WITH AN INCREASED DENSITY FOR MOUNTING SEMICONDUCTOR CHIPS

This is a continuation of U.S. Ser. No. 09/499,618, filed Feb. 7, 2000 now abandoned, and is related to U.S. Ser. No. 10/029,979, filed Dec. 31, 2001.

FIELD OF THE INVENTION

The present invention relates to technology for manufacturing a semiconductor and, particularly, to technology that can be effectively applied to highly densely mounting the semiconductor chips on a memory-module.

BACKGROUND OF THE INVENTION

The technology described below is the one discussed by the present inventors in studying and accomplishing the present invention, and is roughly as described below.

A memory-module is one of the module products mounting a plurality of semiconductor devices.

The memory-module includes a plurality of semiconductor devices having memory chips that are mounted on one surface or on both the front and back surfaces of a module board. In mounting the memory on a personal computer or a work station, the memory-module mounts the memory by being mounted on a mother board provided in the personal computer or the work station with each module as a unit.

As the semiconductor device mounted on the memory-module, there has been used the one of the surface mount type called SMD (surface mount device) having a semiconductor chip sealed with a resin and having lead terminals (external terminals) for drawing the electrodes to the outside of the resin-sealed portion, as represented by TSOP (thin small outline package) and TCP (tape carrier package).

Module products of various structures have been disclosed in, for example, Japanese Patent Laid-Open Nos. 209368/1998, 258466/1989 and 86492/1995.

Japanese Patent Laid-Open No. 209368/1998 discloses a CPU (central processing unit) module, and Japanese Patent Laid-Open No. 258466/1989 discloses a memory-module mounting SMD parts having a DRAM (dynamic random access memory) chip. Japanese Patent Laid-Open No. 86492/1995 discloses technology for applying an underfiller resin in the MCM (multi-chip module).

SUMMARY OF THE INVENTION

The SMD parts to be mounted on the above-mentioned conventional memory-module have a large package size compared with the chip size due to the package body (semiconductor device body) that is sealed and the outer leads.

As a result, limitation is imposed on the number of the semiconductor chips that can be mounted on the module board.

There further arouses a problem in that due to the inductance added as a result of the sealing, it becomes difficult to design a memory-module having a high-speed interface to meet a high-speed CPU.

The object of the present invention is to provide a memory-module that offers an increased module capacity as a result of enhancing the density for mounting the semiconductor chips and is capable of coping with a high-speed bus, and a method of manufacturing the same.

The above and other objects as well as novel features of the present invention will become obvious from the description of the specification and the attached drawings.

Briefly described below are representative examples of the inventions disclosed in this application.

That is, the memory-module of the present invention comprises protruded terminal semiconductor devices having protruded terminals as external terminals, mounted via the protruded terminals, and are provided with wiring portions for expanding the pitch among the protruded terminals to be wider than the pitch among the bonding electrodes of semiconductor chips; lead terminal semiconductor devices having outer leads as external terminals, and are mounted via the outer leads that are electrically connected to the bonding electrodes of the semiconductor chips; and a module board supporting the protruded terminal semiconductor devices and the lead terminal semiconductor devices; wherein the protruded terminal semiconductor devices and the lead terminal semiconductor devices are mounted in a mixed manner on the module board.

Further, the memory-module of the invention comprises protruded terminal semiconductor devices of a chip size having protruded terminals as external terminals, mounted via the protruded terminals, and are provided with rewirings which are wiring portions for expanding the pitch among the protruded terminals to be wider than the pitch among the bonding electrodes in the areas of semiconductor chips; lead terminal semiconductor devices having outer leads as external terminals, and are mounted via the outer leads that are electrically connected to the bonding electrodes of the semiconductor chips; and a module board supporting the protruded terminal semiconductor devices and the lead terminal semiconductor devices; wherein the protruded terminal semiconductor devices and the lead terminal semiconductor devices are mounted in a mixed manner on the module board.

In mounting the protruded terminal semiconductor devices together with the lead terminal semiconductor devices in a mixed manner, therefore, the mounting is accomplished requiring mounting areas nearly equal to those of the semiconductor chips.

Therefore, the semiconductor chips can be mounted requiring the least areas, making it possible to increase the density for mounting the semiconductor chips.

This makes it possible to increase the module capacity of the memory-module.

The method of manufacturing a memory-module according to the present invention comprises a step for preparing protruded terminal semiconductor devices having protruded terminals as external terminals, and wiring portions for expanding the pitch of the protruded terminals to be wider than the pitch of the bonding electrodes of semiconductor chips; a step for preparing lead terminal semiconductor devices having outer leads which are the external terminals electrically connected to the bonding electrodes of the semiconductor chips; a step for arranging the protruded terminal semiconductor devices and the lead terminal semiconductor devices on a module board; and a step for simultaneously reflowing the protruded terminal semiconductor devices and the lead terminal semiconductor devices to mount them on the module board; wherein the protruded terminal semiconductor devices and the lead terminal semiconductor devices; are mounted in a mixed manner on the module board.

Further, the method of manufacturing a memory-module of the present invention comprises a step for preparing protruded terminal semiconductor devices of a chip size having protruded terminals as external terminals, and rewirings which are wiring portions for expanding the pitch of the protruded terminals to be wider than the pitch of the bonding electrodes in the areas of semiconductor chips; a step for preparing lead terminal semiconductor devices having outer leads which are external terminals electrically connected to the bonding electrodes of the semiconductor chips; a step for arranging the protruded terminal semiconductor devices and the lead terminal semiconductor devices on a module board; and a step for simultaneously reflowing the protruded terminal semiconductor devices and the lead terminal semiconductor devices to mount them on the module board; wherein the protruded terminal semiconductor devices and the lead terminal semiconductor devices are mounted in a mixed manner on the module board.

BRIEF DESCRIPTION OF THE DRAWINGS

FIGS. 1A, 1B and 1C are diagrams illustrating the structure of a memory-module according to an embodiment 1 of the present invention, wherein FIG. 1A is a plan view, FIG. 1B is a side view, and FIG. 1C is a sectional view along the A—A section of FIG. 1A;

FIG. 4 is a perspective view illustrating the appearance of the structure of a wafer process package (protruded terminal semiconductor device) mounted on the memory-module shown in FIG. 1;

FIGS. 5A and 5B are diagrams illustrating an SMD (lead terminal semiconductor device) mounted on the memory-module shown in FIG. 1 and the structure of a wafer process package, wherein FIG. 5A is a plan view of the SMD and FIG. 5B is a plan view of the wafer process package;

FIGS. 11A, 11B, 11C, 11D, 11E, 11F, 11G and 11H are views illustrating the permeation of the underfiller resin that is applied as shown in FIG. 10, and wherein FIGS. 11A, 11C, 11E and 11G are perspective views and FIGS. 11B, 11D, 11F and 11H are plan views showing the semiconductor chip in a see-through manner;

FIGS. 14A, 14B, 14C, 14D, 14E, 14F, 14G and 14H are views illustrating the permeation of the underfiller resin that is applied according to a modified example of the embodiment 1 of the invention, and wherein FIGS. 14A, 14C, 14E and 14G are perspective views and FIGS. 14B, 14D, 14F and 14H are plan views illustrating a semiconductor chip in a see-through manner;

FIGS. 15A and 15B are view illustrating a modified structure of the memory-module according to the embodiment 1 of the present invention, wherein FIG. 15A is a plan view and FIG. 15B is a side view;

FIGS. 20A and 20B are views illustrating the structure of a memory-module according to an embodiment 3 of the present invention, wherein FIG. 20A is a plan view and FIG. 20B is a side view;

FIGS. 28A, 28B and 28C are views illustrating the structure of a CSP which is a modified example of the protruded terminal semiconductor device mounted on the memory-module of the present invention, wherein FIG. 28A is a plan view, FIG. 28B is a sectional view and FIG. 28C is a bottom view;

FIGS. 29A and 29B are views illustrating the structure of a BGA of the chip face-up mounting system which is a modified example of the protruded terminal semiconductor device mounted on the memory-module of the present invention, wherein FIG. 29A is a perspective view illustrating the appearance and FIG. 29B is a sectional view; and FIGS. 30A, 30B and 30C are views illustrating the structure of the BGA of the chip face-down mounting system which is a modified example of the protruded terminal semiconductor device mounted on the memory-module of the present invention, wherein FIG. 30A is a plan view, FIG. 30B is a sectional view and FIG. 30C is a bottom view.

DESCRIPTION OF THE PREFERRED EMBODIMENTS

Embodiments of the present invention will now be described in detail with reference to the drawings.

(Embodiment 1)

Figure 2:
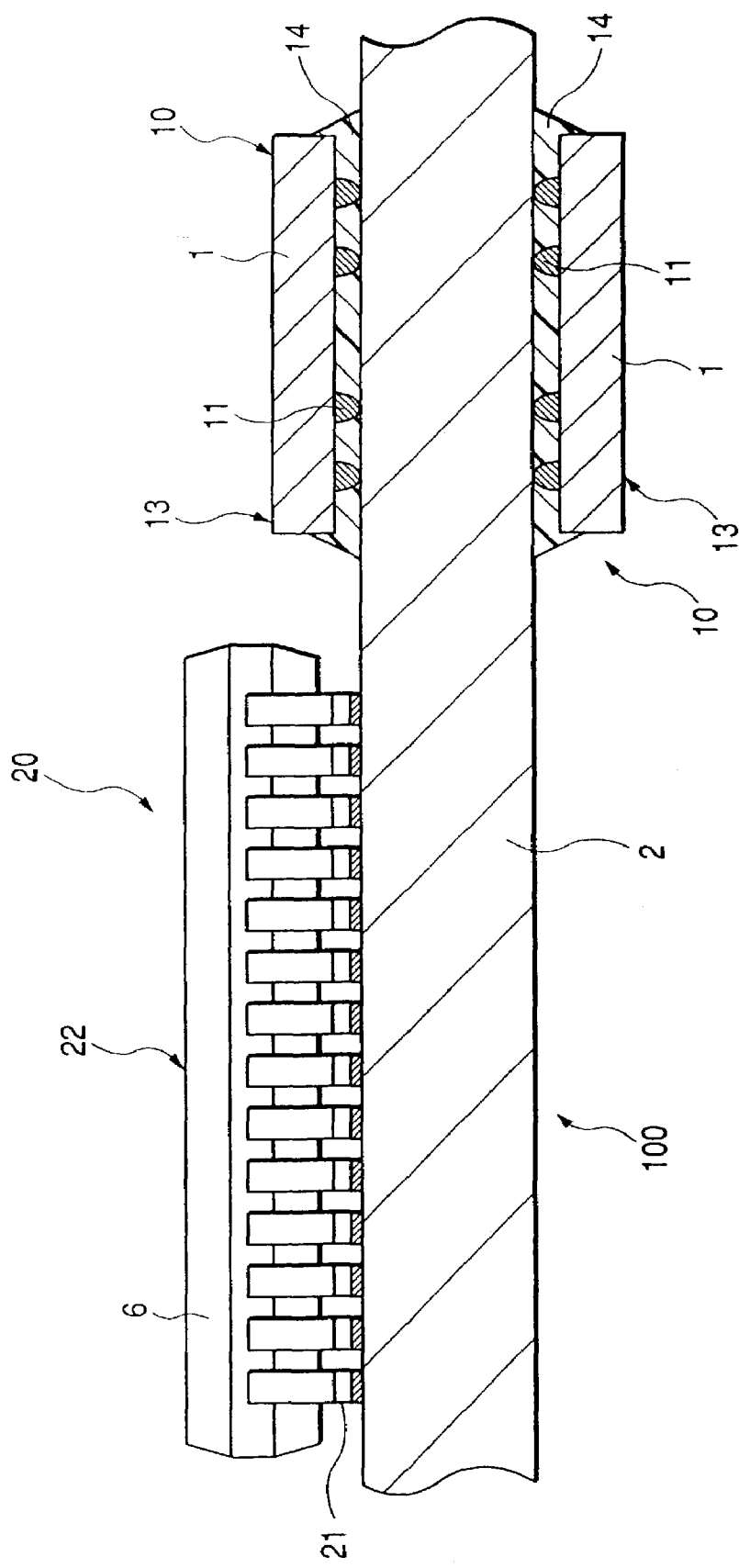
FIG. 2 is an enlarged partial sectional view illustrating, on an enlarged scale, a portion B in the sectional view of FIG. 1C.
Figure 3:
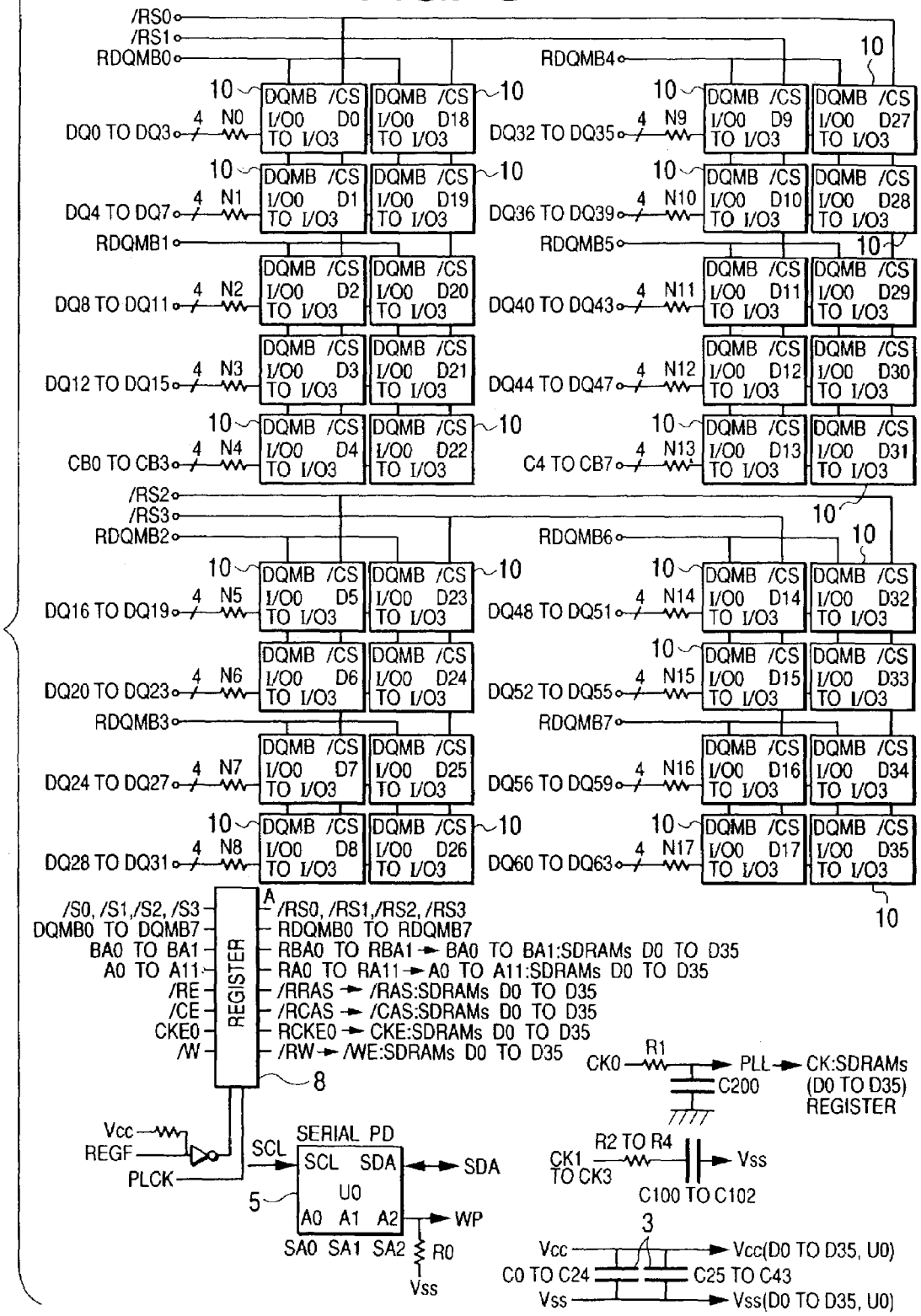
FIG. 3 is a view of block circuits of the memory-module shown in FIG. 1.
Figure 5A:
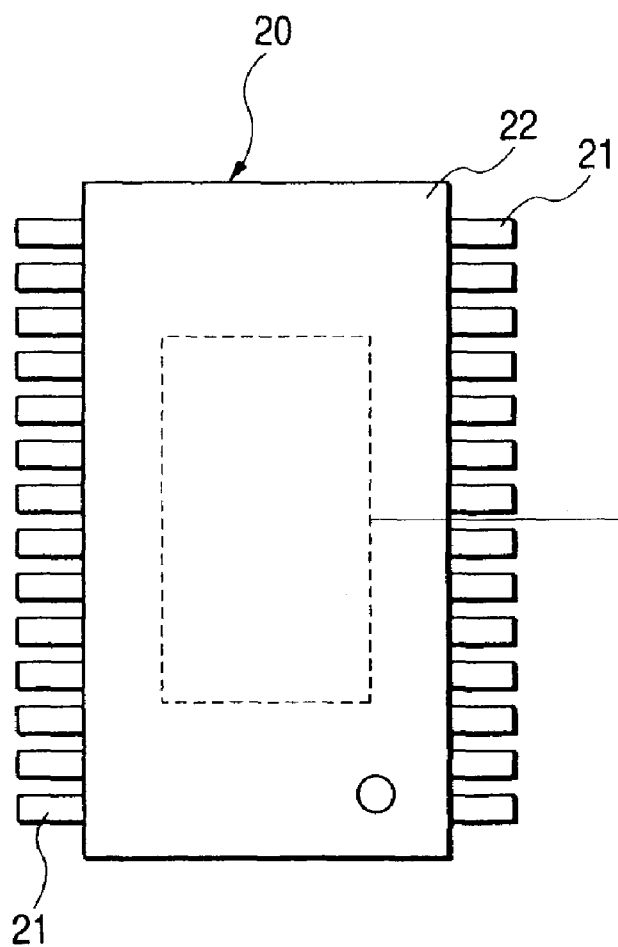
Figure 5B:
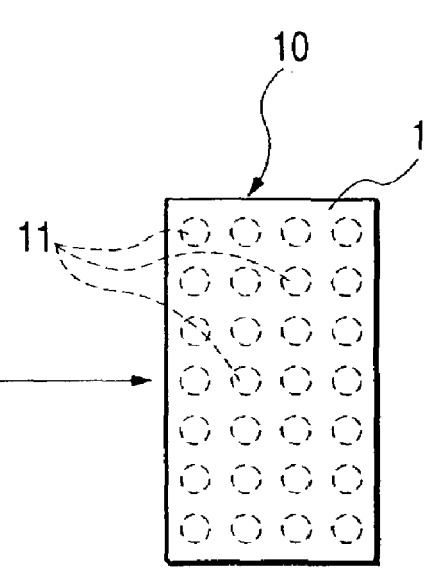
Figure 6:
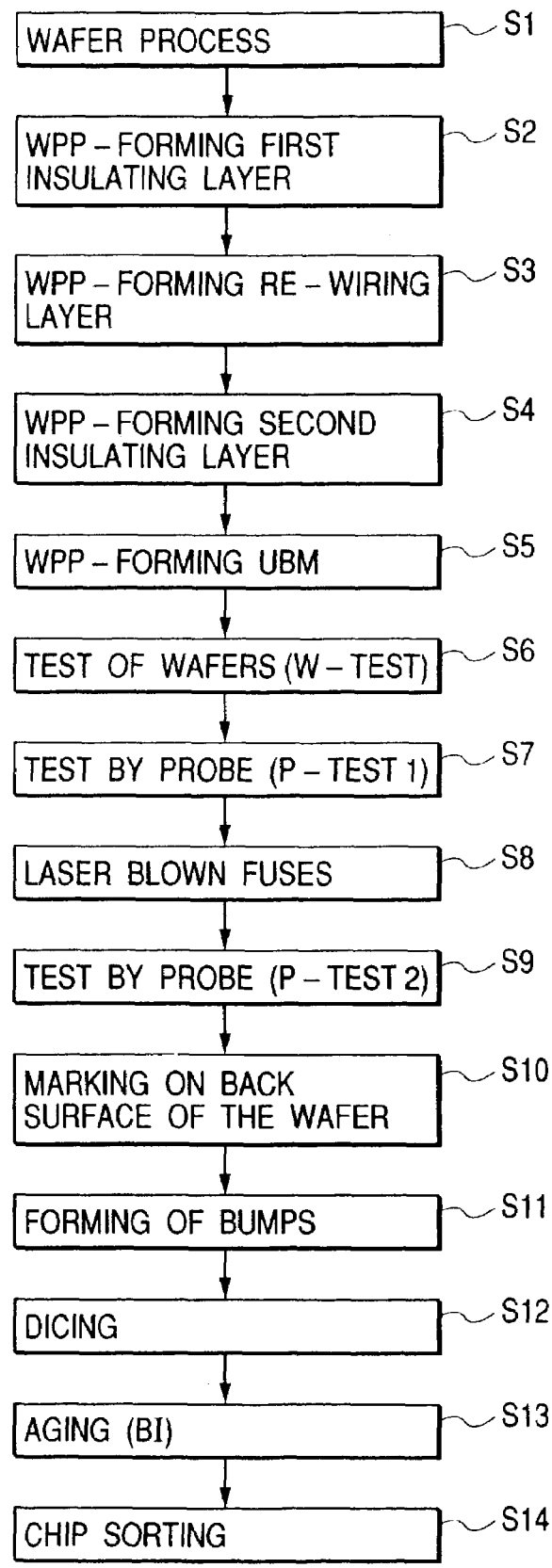
FIG. 6 is a process flow illustrating the steps for manufacturing the wafer process package mounted on the memory-module shown in FIG. 1.
Figure 7A:
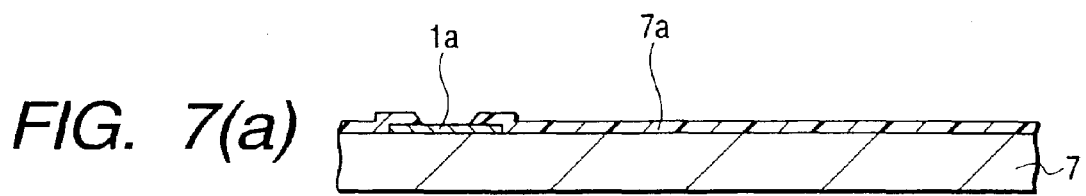
FIGS. 7A, 7B, 7C, 7D, 7E and 7F are enlarged partial sectional views illustrating the structure of the semiconductor wafer corresponding to the major steps in the process flow shown in FIG. 6.
Figure 7B:
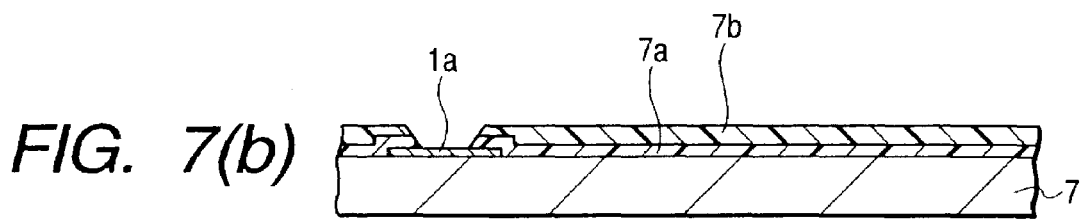
Figure 7C:
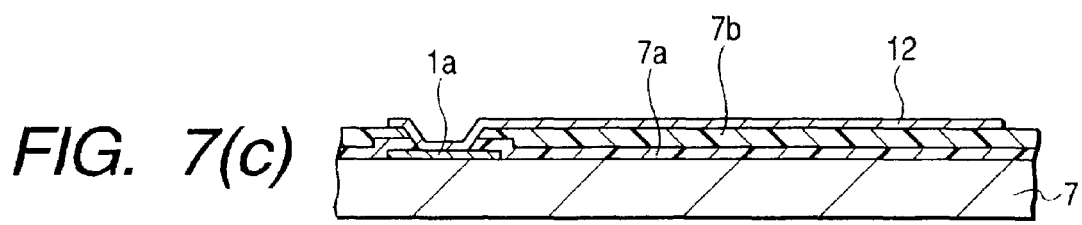
Figure 7D:
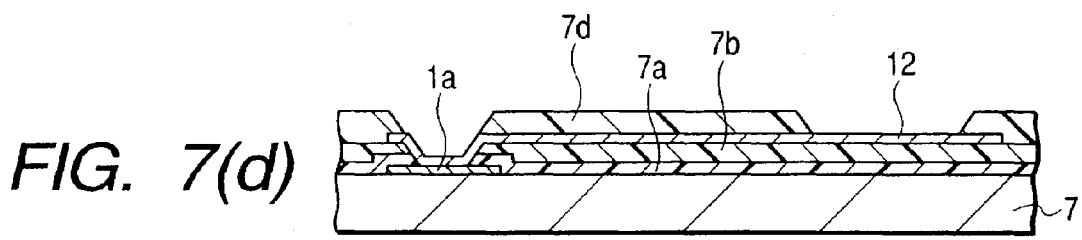
Figure 7E:
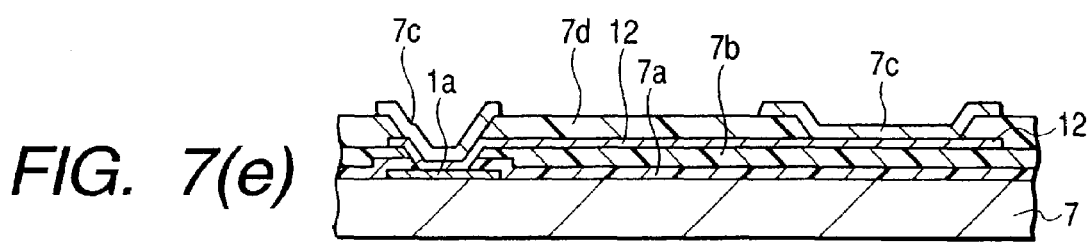
Figure 7F:
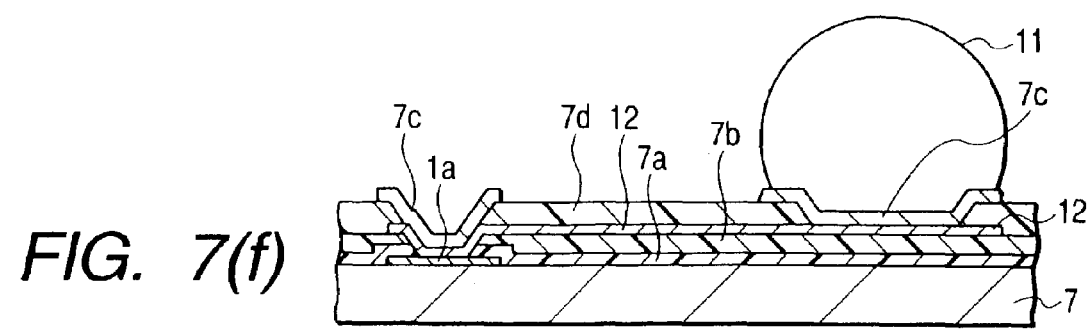
Figure 8:
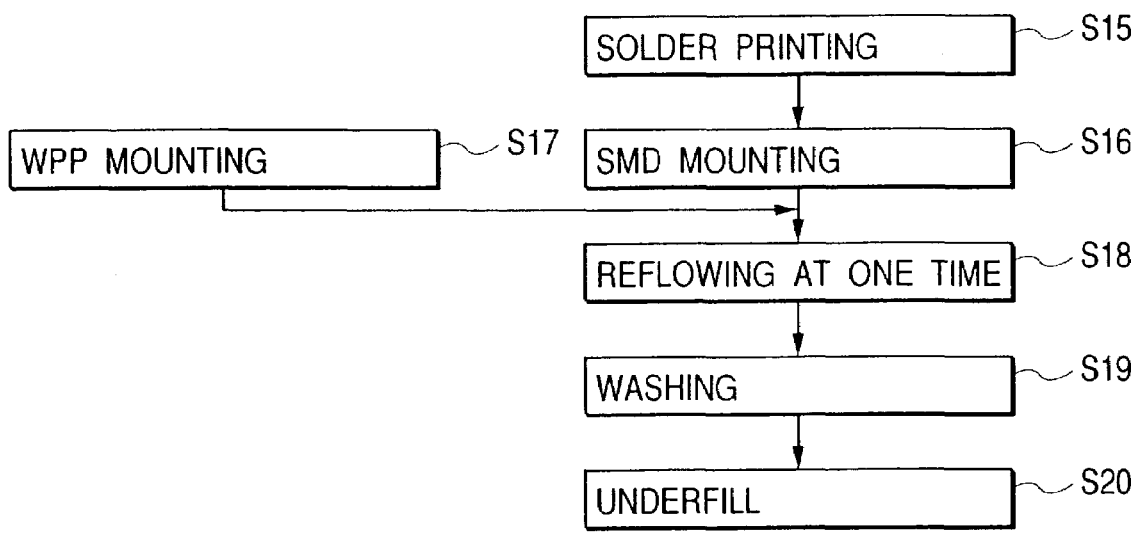
FIG. 8 is a basic mounting flow illustrating the procedure for mounting the wafer process package and the SMD on the module board so as to be mounted on the memory-module shown in FIG. 1.
Figure 9:
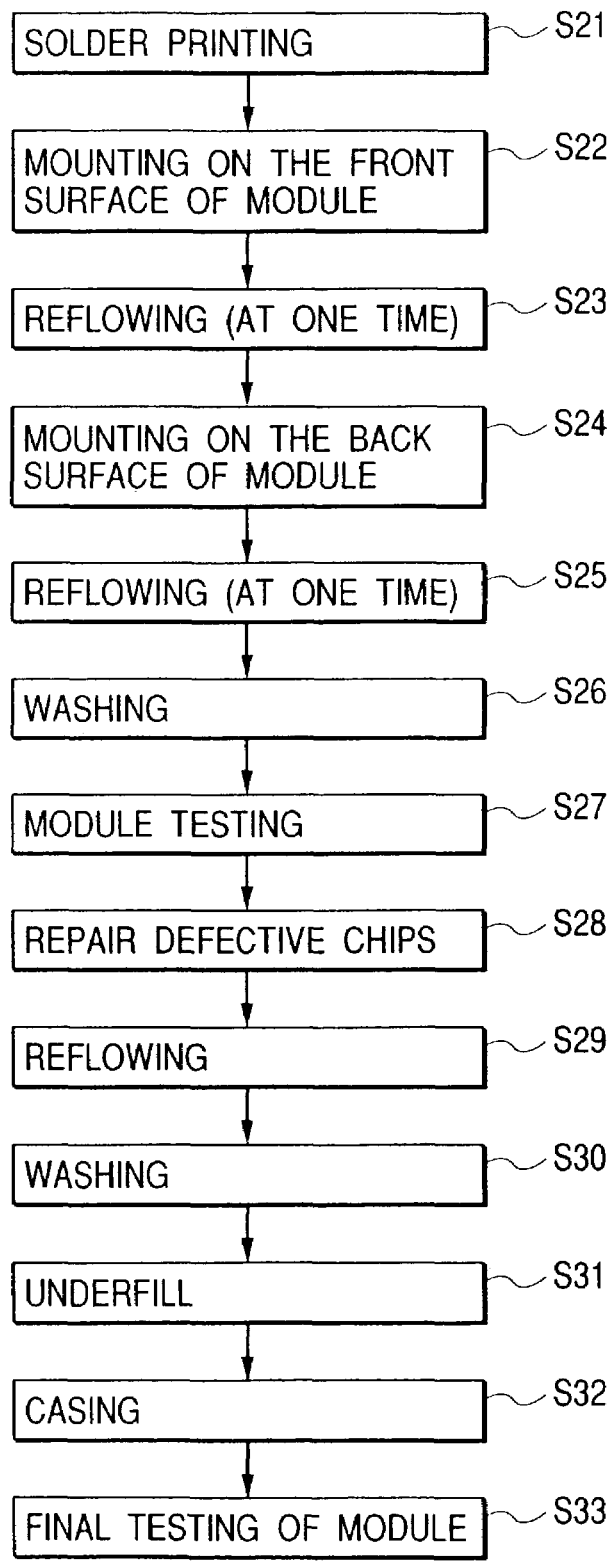
FIG. 9 is a mounting flow illustrating the procedure for mounting the wafer process package on the module board so as to be mounted on the memory-module shown in FIG. 1.
Figure 10:
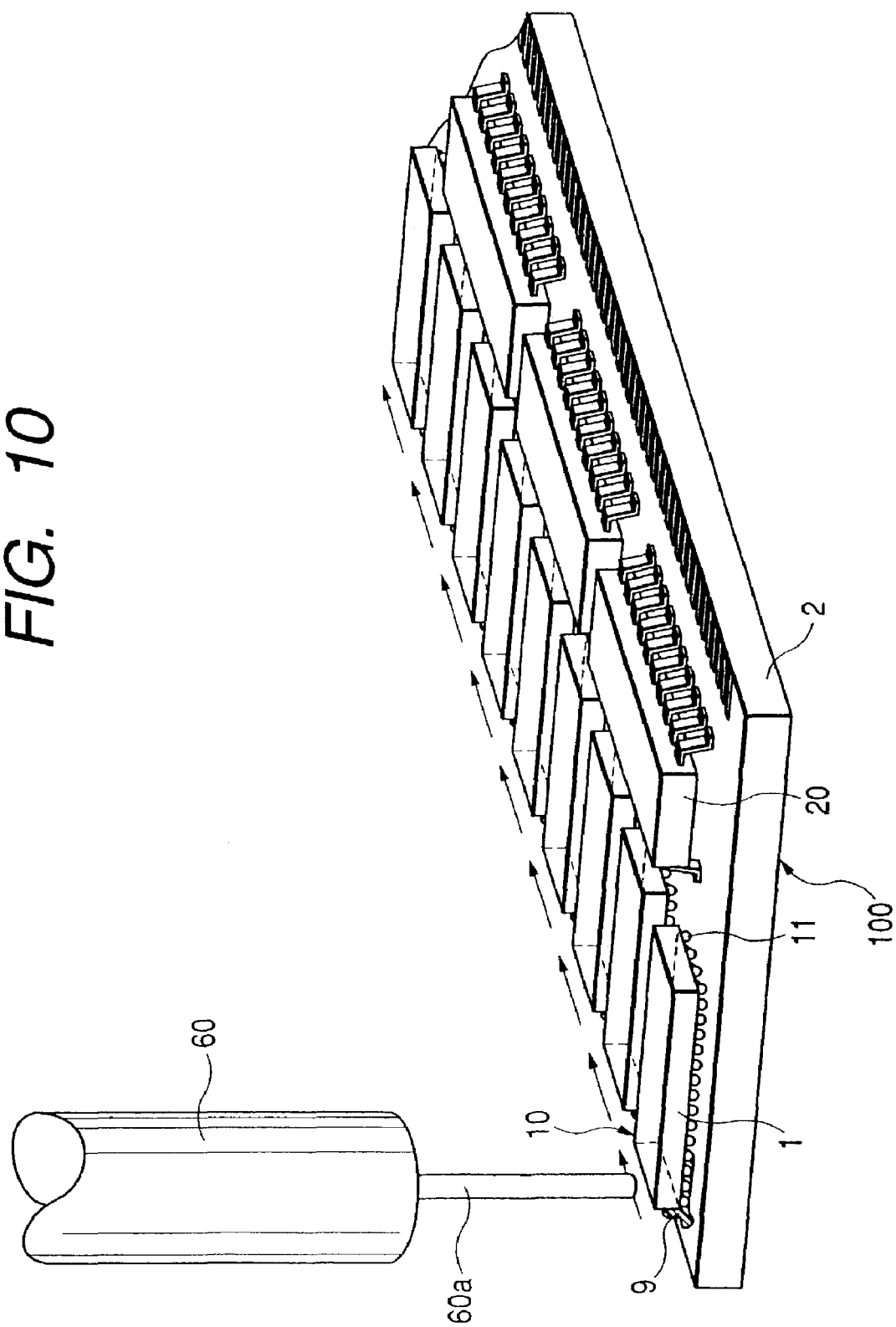
FIG. 10 is an enlarged partial perspective view illustrating a method of applying an underfiller resin onto the wafer process package mounted on the memory-module shown in FIG. 1.
Figures 11A, 11C, 11E, 11G:
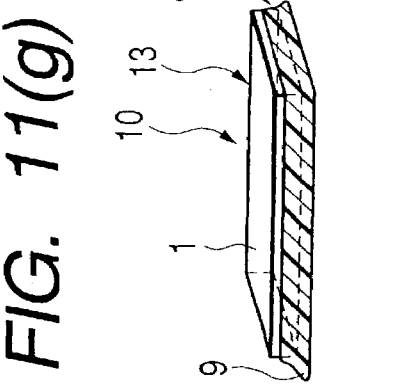
Figures 11B, 11D, 11F, 11H:
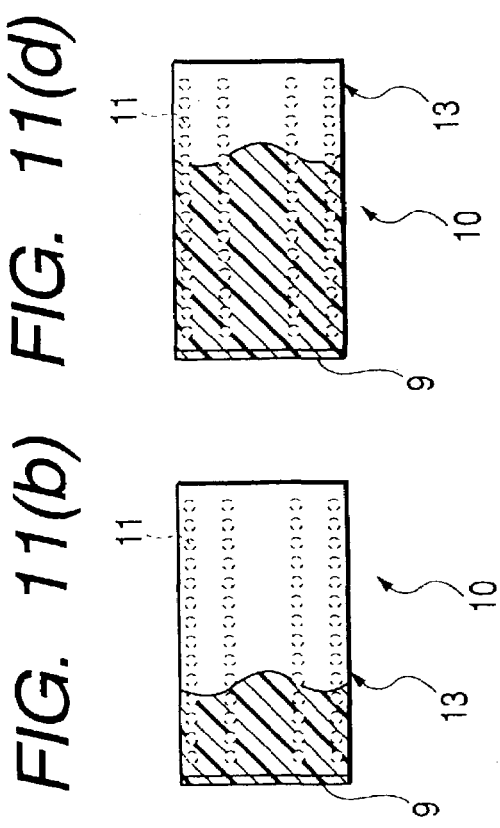
Figure 12:
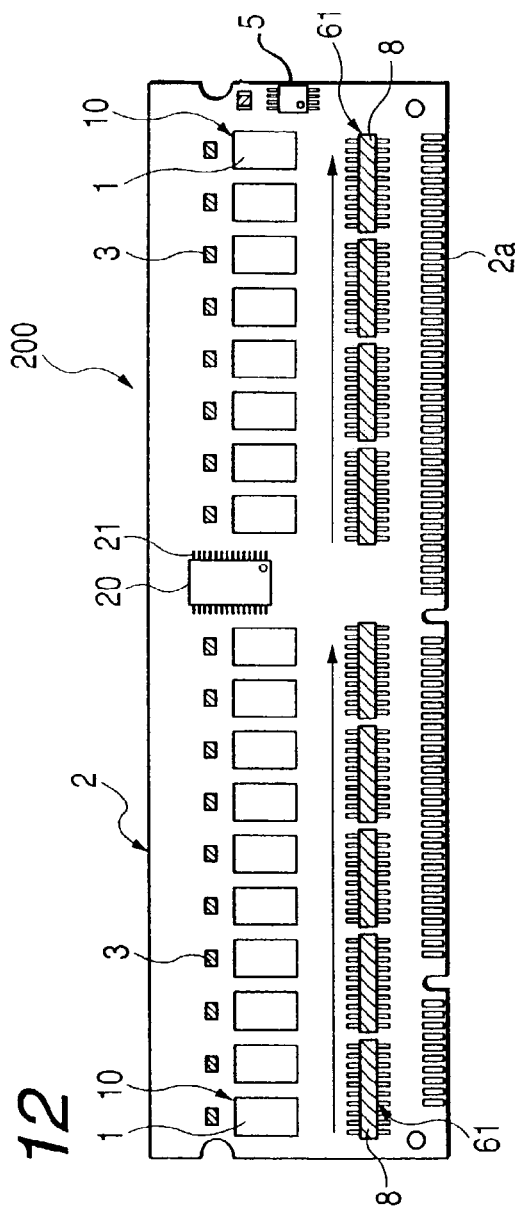
FIGS. 12 is a plan view illustrating a modified structure of the memory-module of the embodiment 1 of the present invention.
Figure 13:
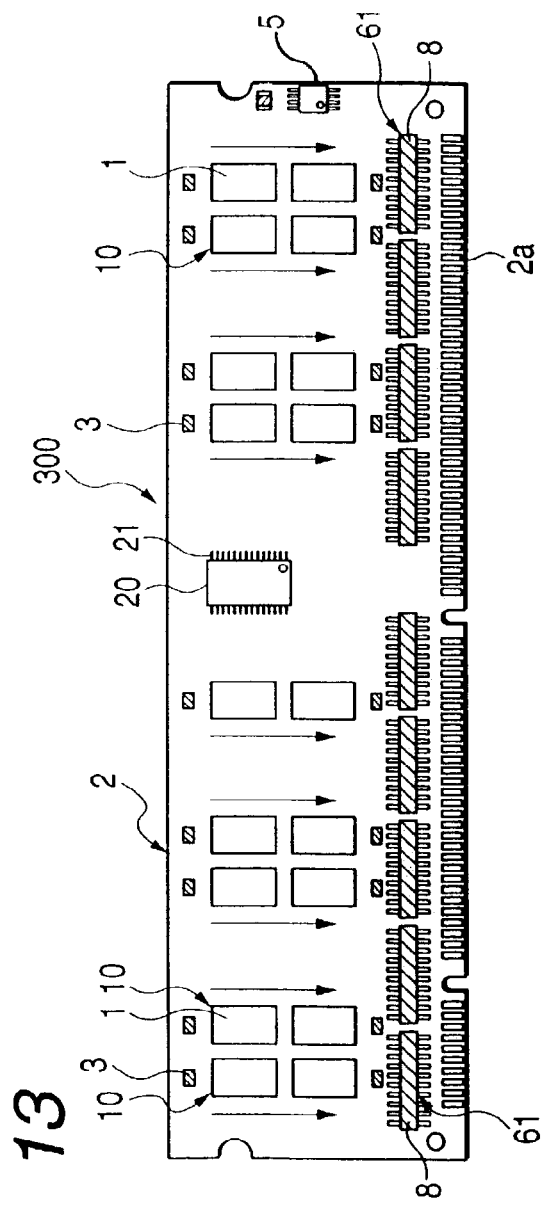
FIG. 13 is a plan view illustrating a modified structure of the memory-module of the embodiment 1 of the present invention.
Figure 15A:
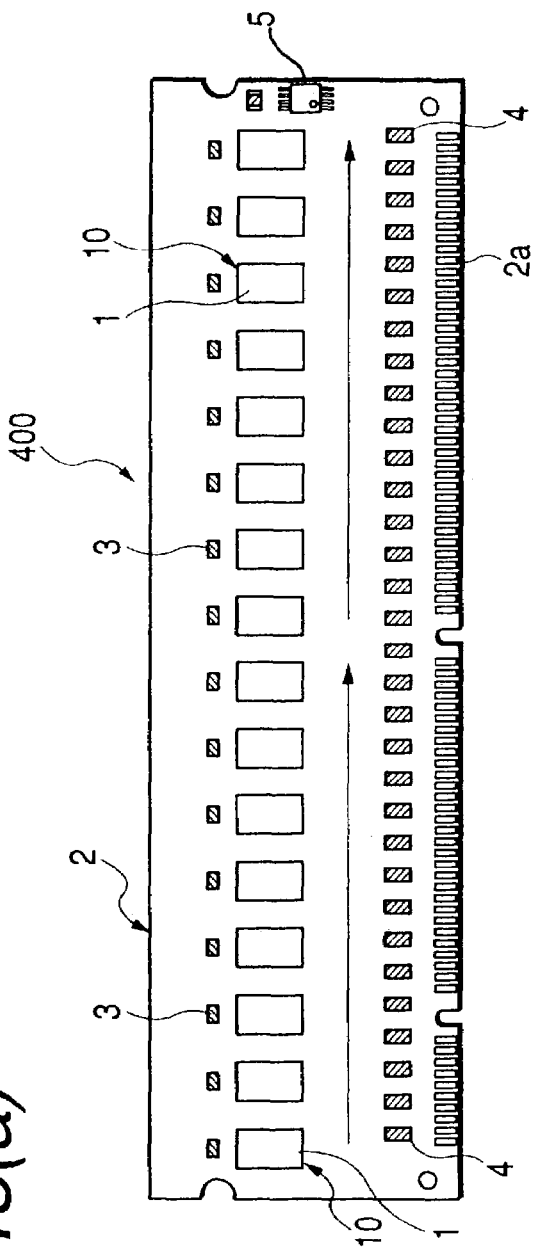
Figure 15B:
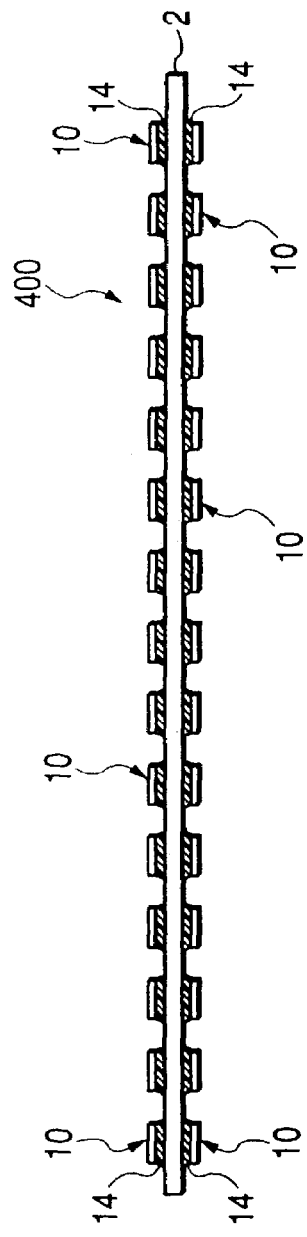
Figure 16:
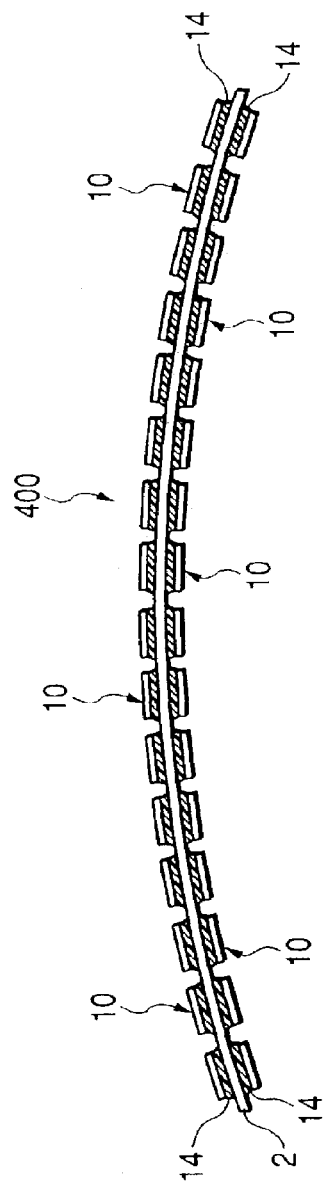
FIG. 16 is a side view illustrating the memory-module of FIG. 15 in a warped state.
Figure 17:
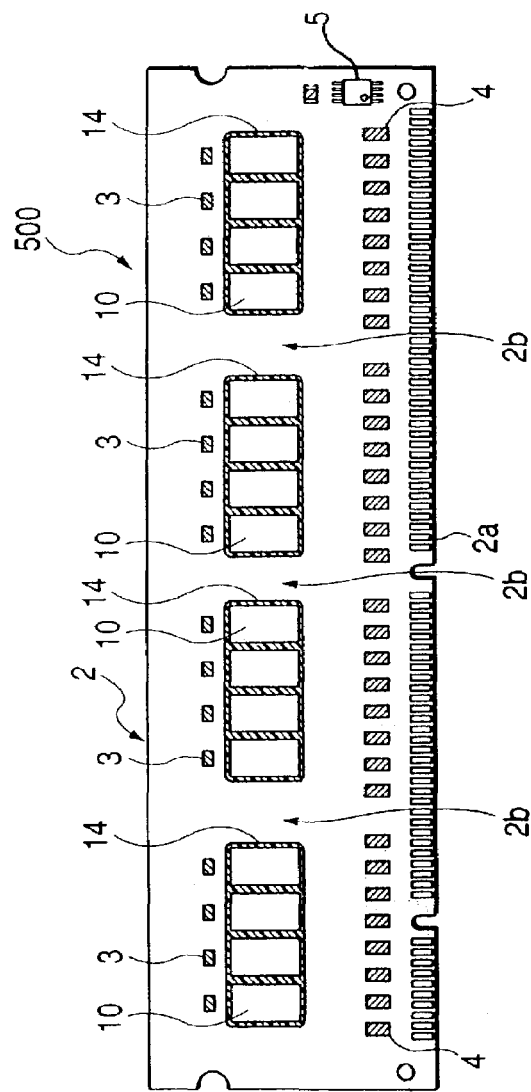
FIG. 17 is a plan view illustrating a modified structure of the memory-module according to the embodiment 1 of the present invention.
Figure 18:
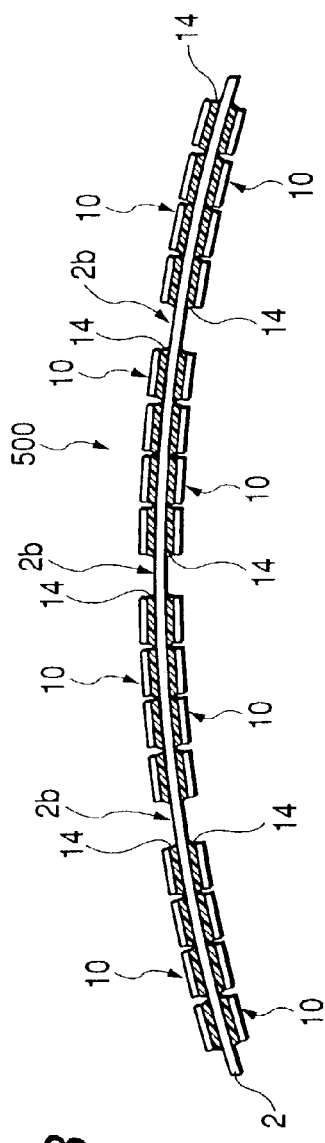
FIG. 18 is a side view illustrating the memory-module of FIG. 11 in a warped state.

FIG. 1 is a diagram illustrating the structure of a memory-module according to an embodiment 1 of the present invention, wherein FIG. 1A is a plan view, FIG. 1B is a side view and FIG. 1C is a sectional view along the A—A section of FIG. 1A, FIG. 2 is an enlarged partial sectional view illustrating, on an enlarged scale, a portion B in the sectional view of FIG. 1C, FIG. 3 is a view of block circuits of the memory-module shown in FIG. 1, FIG. 4 is a perspective view illustrating the appearance of the structure of a wafer process package (protruded terminal semiconductor device) mounted on the memory-module shown in FIG. 1, FIG. 5 is a diagram illustrating an SMD (surface mount-type semiconductor device having lead terminals, which is hereinafter referred to as lead terminal semiconductor device) mounted on the memory-module shown in FIG. 1 and the structure of a wafer process package, wherein FIG. 5A is a plan view of the SMD and FIG. 5B is a plan view of the wafer process package, FIG. 6 is a process flow illustrating the steps for manufacturing the wafer process package mounted on the memory-module shown in FIG. 1, FIGS. 7A, 7B, 7C, 7D, 7E and 7F are enlarged partial sectional views illustrating the structure of the semiconductor wafer corresponding to the major steps in the process flow shown in FIG. 6, FIG. 8 is a basic mounting flow illustrating the procedure for mounting the wafer process package and the SMD on the module board so as to be mounted on the memory-module shown in FIG. 1, FIG. 9 is a mounting flow illustrating the procedure for mounting the wafer process package on the module board so as to be mounted on the memory-module shown in FIG. 1, FIG. 10 is an enlarged partial perspective view illustrating a method of applying an underfiller resin onto the wafer process package mounted on the memory-module shown in FIG. 1, FIGS. 11A, 11C, 11E and 11G are perspective views illustrating the permeation of the underfiller resin that is applied as shown in FIG. 10 and FIGS. 11B, 11D, 11F and 11H are plan views showing the semiconductor chip in a see-through manner, FIGS. 12 and 13 are plan views illustrating the modified structures of the memory-module of the embodiment 1 of the present invention, FIGS. 14A, 14C, 14E and 14G are perspective views illustrating the permeation of the underfiller resin that is applied according to modified examples of the embodiment 1 of the invention and FIGS. 14B, 14D, 14F and 14H are plan views illustrating a semiconductor chip in a see-through manner, FIG. 15 is a view illustrating a modified structure of the memory-module according to the embodiment 1 of the present invention, wherein FIG. 15A is a plan view and FIG. 15B is a side view, FIG. 16 is a side view illustrating the memory-module of FIG. 15 in a warped state, FIG. 17 is a plan view illustrating a modified structure of the memory-module according to the embodiment 1 of the present invention, and FIG. 18 is a side view illustrating the memory-module of FIG. 17 in a warped state.

A memory-module 100 of the embodiment 1 shown in FIG. 1 comprises protruded terminal semiconductor devices having protruded terminals as external terminals, mounted via the protruded terminals and having wiring portions for expanding the pitch among the protruded terminals to be wider than the pitch among the bonding electrodes 1a of the semiconductor chips 1; TSOPs (thin small outline packages) which are lead terminal semiconductor devices 20 having semiconductor chips, outer leads 21 as the external terminals and are mounted via the outer leads 21 which are electrically connected to the bonding electrodes 1a of the semiconductor chips 1; and a module board 2 for supporting the protruded terminal semiconductor devices and TSOPs 20; wherein the protruded terminal semiconductor devices and the TSOPs 20 are mounted in a mixed manner on the module board 2 by the simultaneous reflowing.

Here, the protruded terminal semiconductor device has a plurality of bump electrodes 11 (protruded terminals) that serve as the external terminals arranged in an area of a package body 13 (semiconductor device body), and wiring portions for expanding the pitch among the bump electrodes 11 to be wider than the pitch among the bonding electrodes 1a of the semiconductor chip 1.

The lead terminal semiconductor device has a plurality of outer leads 21 serving as the external terminals that are arranged protruding from the package body 22 (semiconductor device body).

In the protruded terminal semiconductor device and the lead terminal semiconductor device, the bonding electrodes 1a of the semiconductor chip 1 are formed by using, for example, aluminum or the like, and are electrically connected to the bonding wires when the wires are to be bonded.

The external terminals of the protruded terminal semiconductor device and of the lead terminal semiconductor device are electrically connected to the connection electrodes on the side of the module board 2 when the semiconductor devices are mounted on the mounting board such as the module board 2.

The embodiment 1 deals with the case where the protruded terminal semiconductor device is a wafer process package (hereinafter abbreviated as WPP) 10 which is a small semiconductor device of a chip size.

Therefore, the memory-module 100 of the embodiment 1 includes WPPs 10 which are the protruded terminal semiconductor devices of a chip size, TSOPs 20 which are SMD (surface mount type package) parts and are lead terminal semiconductor devices, and an EEPROM (electrically erasable programmable read-only memory) 5 which is a non-volatile read-only memory as an example of another lead terminal semiconductor device, that are mounted in a mixed manner on the module board 2.

Here, as shown in FIG. 4, the WPP 10 is a protruded terminal semiconductor device having bump electrodes 11 which are the protruded terminals serving as the external terminals, and is mounted on the module board 2 via bump electrodes 11, and is provided with rewirings 12 which are wiring portions for expanding the pitch among the bump electrodes 11 to be wider than the pitch among the bonding electrodes 1a in an area of the semiconductor chip 1.

The bump electrodes 11 used for the WPP 10 have little dispersion in the height, decreasing percent defective when it is mounted on the board and, hence, improve the mounting yield. Besides, the bump electrodes 11 have a mounting height of about 0.13 mm, which makes it possible to decrease the mounting height.

Referring to FIG. 1, on the memory-module 100 are further mounted capacitors 3, small surface-attached resistors 4 and other electronic parts in addition to the WPPs 10, TSOPs 20 and EEPROM 5.

That is, the memory-module 100 of the embodiment 1 includes 18 WPPs 10, two TSOPs 20, 18 capacitors 3, 36 small surface-attached resistors 4 and one EEPROM 5 that are mounted on either the front surface or the back surface thereof, and 18 WPPs 10 that are mounted on the surface on the opposite side thereof.

In the memory-module 100 of the embodiment 1, there are arranged the WPPs 10 in a total number of 18 in a sequence on both sides of the two TSOPs 20 (ten on one side and eight on the other side with the TSOPs 20 being sandwiched therebetween) on one surface of the module board 2.

Between the two TSOPs 20, the one (TSOP 20 arranged on the upper side in FIG. 1) is a PLL (phase-locked loop) 6 which is a frequency control means and the other one (TSOP 20 arranged on the lower side in FIG. 1) is a register 8 having a register function.

That is, in the memory-module 100 of the embodiment 1, both the PLL 6 and the register 8 are the lead terminal semiconductor devices.

Each capacitor 3 is arranged to correspond to each WPP 10 close thereto.

Further, a total of 36 small surface-attached resistors 4 are arranged in sequence; i.e., two for each WPP 10. The small surface-attached resistors 4 are provided to correspond to the I/Os of the memory-module 100. In the memory-module 100 of the embodiment 1, there are provided 36 I/Os on one surface and, hence, the surface-attached resistors 4 are mounted in a number of 36. The small surface-attached resistors 4 of the number of 36 are arranged in a sequence nearly along and near the connection terminals 2a which are the external terminals of the module board 2.

Referring to FIG. 1A, the module board 2 of the memory-module 100 measures, for example, L=133.35 mm and M=38.1 mm, and the mounting height (max) is N=4 mm as shown in FIG. 1B.

In the memory-module 100 of the embodiment 1, further, the TSOPs 20 and the WPPs 10 are mounted by the simultaneous reflowing. As shown in FIG. 2, however, the WPP 10 is sealed with the underfiller resin after the reflow, so that a sealing portion 14 is formed.

That is, the surrounding of the bump electrodes 11 between the package body 13 of WPP 10 and the module board 2 is sealed with a resin thereby to form the sealed portion 14.

The memory-module 100 shown in FIG. 1 uses the WPPs 10 as DRAMs and further uses the module board 2 of a bus of a width of 72 bits with error code correction.

Therefore, the memory-module 100 mounts a total of 36 DRAMs (WPPs 10) on both the front and back surfaces of the module board 2. When the DRAM has, for example, 64 megabits (16 M×4), the DRAM module has a constitution of 16 words×72 bits×2 banks.

FIG. 3 is a diagram of block circuits of the memory-module 100 shown in FIG. 1, i.e., the diagram of block circuits of the DRAM module of the constitution of 16 words×72 bits×2 banks.

In the structure of FIG. 3, the RS0 system and the RS2 system of the bank 1 operate simultaneously, and the RS1 system and the RS3 system of the bank 2 operate simultaneously. The bank 1 or the bank 2 is selected by a register 8. When the bank 1 is read out, the bank 2 is not read out. Similarly, when the bank 2 is read out, the bank 1 is not read out.

A terminal A (S0 to S3) of the register 8 is connected to a chip select (CS) terminal of the DRAM (WPP 10) of either the bank 1 or the bank 2. The bank that is selected by the register 8 forms an input to the CS terminal of the selected semiconductor chip 1.

D0 to D35 of each chip represent the WPPs 10 of the number of 36, and the [I (input)/O (output) 0 to I/O 3 ] terminals of each chip are connected to the connection terminals 2a of the module board 2 as independent terminals.

In all DRAMs, the I/Os used as data consist of 64 bits of from DQ0 to DQ63, and the I/Os used as check consist of 8 bits of from CB0 to CB7. The sum of the two constitutes a two-bank constitution of 72 bits.

Symbols attached to the terminals shown in FIG. 3 are described below. [A0 to A11] are address inputs, [DQ0 to DQ63] are data inputs/outputs, [CB0 to CB7] are check bits (data inputs/outputs), [S0 to S3] are chip select inputs, [RE] is a row enable (RAS) input, [CE] is a column enable (CAS) input, [W] is a write enable input, [DQMB0 to DQMB7] are bite data masks, [CK0 to CK3] are clock inputs, [CKE0] is a clock enable input, [WP] is a write protection for serial PD, [REGE] is a register enable, [SDA] is a data input/output for serial PD, [SCL] is a clock input for serial PD, [SA0 to SA2] are serial address inputs, [Vcc] is a power source of the high-potential side, [Vss] is a ground, and [NC] is a non-connection.

Next, the structure of the WPP 10 will be described in detail. Referring to FIG. 4, the bonding electrodes 1a of the semiconductor chip 1 in the WPP 10 are electrically connected to the solder bump electrodes 11 which are the external terminals through rewirings 12.

That is, the bonding electrodes 1a arranged at a narrow pitch are expanded by the rewirings 12 to a pitch of the bump electrodes 11 that are electrically connected thereto.

This is to form a package of a chip size by forming functional portions of the elements in a unit of the wafer and, then, effecting the dicing to divide into individual semiconductor chips 1.

Therefore, the device is efficiently produced at a low cost compared with the small packages assembled by a method of production similar to that of manufacturing packages of the SMD (surface mount type) parts.

FIG. 5 illustrates the TSOP 20 which is an SMD part and the WPP 10 which is the protruded terminal semiconductor device of the chip size, from which a difference in the size can be comprehended.

FIG. 5A is a plan view of the TSOP 20 mounted on the memory-module 100 shown in FIG. 1, and FIG. 5B is a plan view of the WPP 10 mounted on the memory-module 100 shown in FIG. 1.

As shown in FIG. 5, compared to the DRAM of the SMD (surface mount) type package such as TSOP 20, the WPP 10 can be realized in a small size since it has neither the inner leads nor the outer leads 21.

By mounting the DRAMs in the form of WPPs 10 on the module board 2 as in the memory-module 100 of the embodiment 1, therefore, the mounting area can be greatly reduced as compared to when the TSOPs 20 that are formed by being individually treated are mounted.

That is, by mounting the WPPs 10, the mounting area can be minimized so far as the semiconductor chips 1 are mounted and, hence, the module capacity can be greatly increased.

The same capacity can be realized even by mounting the flip chips which is the mounting of bare chips. In mounting the flip chips, however, there is formed no rewiring 12. Accordingly, the pitch is small among the external terminals, and it is not allowed to accomplish the mounting by reflow simultaneously with the SMD type parts. Therefore, the parts mounting the bare chips must be mounted one by one by using a flip chip bonder, which is inferior in efficiency to mounting the WPPs 10.

In other words, the WPPs 10 are mounted without using any special mounting device such as the flip chip bonder, and makes it possible to decrease the number of the steps for mounting.

Further, the WPPs 10 can be mounted permitting the pitch among the bump electrodes 11 that are the external terminals to be expanded to be broader than the pitch of when the flip chips are mounted, enabling the wiring rule to be broadened on the module board 2. This does not drive up the cost of the module board 2, and makes it possible to realize the memory-module 100 of a highly dense mounted form suppressing the cost.

In the WPP 10, further, the wiring lengths from the bonding electrodes 1a of the semiconductor chip 1 to the bump electrodes 11 which are the external terminals become shorter than the wiring lengths from the bonding electrodes 1a to the ends of the outer leads 21 of the SMD part such as TSOP 20, making it possible to transfer signals at a high speed.

This enables the memory-module 100 to operate at high speeds and, hence, to cope with a high-speed bus.

Described below is the reason why the semiconductor devices (packages) mounted on the memory-module 100 of the embodiment 1 are not all in the form of WPPs 10, i.e., why the WPPs 10 which are the protruded terminal semiconductor devices of the chip size and the SMD parts (TSOPs 20 in the embodiment 1) are mounted in a mixed manner.

The WPPs 10 are formed by treating the wafers in the preceding steps. In the subsequent steps, therefore, they are all treated in a unit of the wafer even in a step of forming the devices one by one.

When the number of non-defective products is small in a piece of wafer, the defective products must be worked, driving up the cost.

As a result, for some kinds of products for which the yields of the semiconductor wafers are not so high, no cost merit is obtained.

Further, a reticle for exposure to light must be prepared for every kind of products. For the products that are not produced in large quantity, therefore, a material having general applicability is used for the semiconductor devices (packages) that are incorporated in the lead frames. Therefore, the products that are not produced in large quantity are better not in the form of the WPPs 10.

Besides, physical conditions play important roles. From a relationship between the number of the terminals to be drawn out and the chip size, the logical devices in the form of small chips but having many terminals to be drawn out, are better not in the form of the WPP 10. This is because the electrode pads (diffusion-preventing adhesion layers 7c shown in FIG. 7) and the bump electrodes 11 cannot be formed after the rewirings 12 are formed from the bonding electrodes 1a.

Therefore, the devices that are better formed as WPPs 10 are those chips produced maintaining a high yield and obtained in a large number per a wafer and, particularly, are those small memory devices.

On the other hand, the devices that are not better in the form of WPPs 10 are those chips produced maintaining a low yield and obtained in a small number per a wafer and, particularly, are those large chips, end devices or devices produced in small quantity. Further, when an ASIC (application specific integrated circuit) having many external terminals compared to the chip area, is obtained in the form of the WPP 10, a sufficiently large pitch is not often maintained among the bump electrodes 11. In this case, too, the package should be in a conventional form for easy mounting.

Next, described below is a method of manufacturing the WPP 10 with reference to a process flow of WPP 10 (see FIG. 1) shown in FIG. 6 and sectional views of the wafer shown in FIG. 7 corresponding to the principal steps in the process flow.

First, the wafer is subjected to a pre-treatment at step S1 shown in FIG. 6. The bonding electrode 1a is exposed on the main surface of the silicon board 7 shown in FIG. 7A thereby to form an inorganic insulating protection film 7a.

Then, a WPP first insulating layer is formed at step S2. That is, as shown in FIG. 7B, the first insulating layer 7b of polyimide or fluorine-contained resin is formed on the inorganic insulating protection film 7a of the silicon board 7.

Then, at step S3, a WPP rewiring layer is formed. That is, as shown in FIG. 7C, a rewiring 12 is formed on the first insulating layer 7b being electrically connected to the bonding electrode 1a.

Then, at step S4, a WPP second insulating layer is formed. That is, as shown in FIG. 7D, a second insulating layer 7d comprising polyimide or epoxy is formed on the rewiring 12.

Then, at step S5, a WPP-UBM (underbump metal) is formed. That is, as shown in FIG. 7E, a diffusion-preventing adhesion layer 7c which is a UBM is formed being electrically connected to the rewiring 12.

Then, at step S6, the wafer is inspected (W-test). This is to inspect whether the wafer has been treated as contemplated relying on the electric characteristics by bringing a probe needle into contact with the electrode pad formed on a scribe area of the semiconductor wafer (silicon board 7).

Then, at step S7, the silicon board 7 is inspected by using the probe (P-test 1). This is to detect defective portions by inspecting whether the semiconductor chip 1 electrically works properly by bringing the probe needle into contact with the bonding electrode 1a of the silicon board 7.

Then, at step S8, the defective portions are relieved; i.e., laser blown fuses is executed. This is to relieve defective portions by cutting the fuse in a redundancy circuit by laser beam.

Then, at step S9, test is effected by using probe (P-test 2). This is to make sure whether the defective portion relieved by the P-test 1 has been corrected.

Then, at step S10, marking is effected on the back surface of the wafer to attach a predetermined mark to the back surface of the silicon board 7.

Then, a bump is formed at step S11. That is, as shown in FIG. 7F, a bump electrode 11 (protruded terminal) which is an external terminal of the WPP 10 is formed on the diffusion-preventing adhesion layer 7c which is the UBM provided at an end drawn out from the bonding electrode 1a on the rewiring 12.

Here, the bump electrode 11 is formed by, for example, a printing method. A metal mask corresponding to the bump-forming position is disposed on the wafer (silicon board 7), a solder paste is applied, the metal mask is removed, followed by reflowing at one time to form the bump electrodes 11 at one time on the wafer.

Then, at step S12, the semiconductor wafer, i.e., the silicon board 7 is cut by dicing, thereby to form the WPP 10 as shown in FIG. 4.

Then, at step S13, the WPP 10 is subjected to the aging, i.e., to the burn-in (BI) testing.

At step S14, the single products are sorted out to select non-defective WPPs 10.

Thus, the fabrication of the WPP 10 is completed.

In the procedure of production shown in FIG. 6, no back grinding step (hereinafter abbreviated as BG) for grinding the back surface of the silicon board 7 was executed after the test by using the probe (P-test 2) at step S9. However, the BG step may be executed after step S9 of test by using the probe (P-test 2) but before step S10 of marking the back surface of the wafer.

Here, the BG step is to decrease the height of the WPP 10 by decreasing the thickness of the silicon board 7 by grinding the back surface of the silicon board 7.

In other words, this is to decrease the thickness of the semiconductor chip 1 in order to decrease the thickness of the WPP 10.

Upon executing the BG step, it is allowed to decrease the height of mounting the WPP 10 (e.g., to decrease to 1 mm or less).

Through the BG step, further, the thickness of the silicon board 7 can be decreased. Even when the scribing width on the silicon board 7 is decreased at the time of dicing to obtain an increased number of the chips, the dicing is effected without hindering the infiltration of the cooling water at the time of dicing into the scribe grooves.

This prevents damage to the silicon board 7 at the time of dicing, and enhances the yield of the silicon boards 7. This is particularly effective at the time of dicing the silicon board 7 having a diameter of 300 mm.

Further, steps S6 to S9 (test of wafer (W-test), test using probe (P-test 1), relief by laser, test using probe (P-test 2)) in the procedure of production shown in FIG. 6 may be executed between step S1 of putting the wafer to the pre-treatment and step S2 of forming the WPP first insulating layer.

That is, steps S6 to S9 are executed after the step S1 of putting the wafer to the pre-treatment.

This makes it possible to execute a series of tests using the probe prior to forming the insulating film on the silicon board 7 and to assemble the WPP 10 without leaving damage even in case the bonding electrode 1a is damaged.

Next, described below with reference to FIGS. 8 and 9 is a method of manufacturing the memory-module 100 shown in FIG. 1 of the embodiment 1.

The memory-module 100 shown in FIG. 1 is obtained by mounting the WPPs 10 on both the front and back surfaces of the module board 2 and mounting the TSOPs 20 on one surface thereof.

First, the WPPs 10 are produced in compliance with the process flow shown in FIG. 6.

That is, the WPPs 10 (protruded terminal semiconductor devices) of the chip size shown in FIG. 4 are prepared through the pre-treatment of the wafer (prepared in a number of 18×2=36), the WPPs 10 having bump electrodes 11 (protruded terminals) serving as external terminals, and rewirings 12 (wiring portions) in the areas of the semiconductor chips 1 for expanding the pitch among the bump electrodes 11 to be wider than the pitch among the bonding electrodes 1a.

In the embodiment 1, the semiconductor chip 1 possessed by the WPP 10 is a DRAM.

In addition to the WPPs 10, there are assembled the lead terminal semiconductor devices which are SMD parts to be mounted on the module board 2.

There are prepared two TSOPs 20 (one being a PLL 6 and the other being a register 8) which are lead terminal semiconductor devices having outer leads 21 that are external terminals electrically connected to the bonding electrodes 1a of the semiconductor chips 1, an EEPROM 5 (lead terminal semiconductor device), and small surface-attached resistors 4 of a number of 36×2=72.

The mounting procedure will be roughly described in compliance with the basic flow for mounting the parts shown in FIG. 8.

At step S15, first, the solder is printed on the module board 2 to form terminals (land pads) for electric connection to the ends of the outer leads 21 of the lead terminal semiconductor devices and to the bump electrodes 11 of the WPPs 10.

Thereafter, SMDs are mounted at step S16 and WPPs 10 are mounted at step S17.

Then, at step S18, reflowing is effected at one time in order to electrically connect the outer leads 21 of the lead terminal semiconductor devices to the land pads, and the bump electrodes 11 of the WPPs 10 to the land pads.

Then, washing is effected at step S19. The washing, however, may not be effected.

Further, at step S20, a resin is underfilled to effect the sealing.

Next, the method of manufacturing the memory-module 100 will be described in detail by using the mounting flow closely illustrated in FIG. 9.

At step S21 shown in FIG. 9, first, the solder is printed on predetermined portions on the module board 2.

Then, at step S22, the parts are mounted on the surfaces of the module. Here, predetermined numbers of WPPs 10 (of a number of 18), TSOPs 20 (of a number of 2), small surface-attached resistors 4 (of a number of 36) and EEPROM 5 (of a number of 1) are arranged on the front surface of the module board 2 using a mounting machine.

Then, at step S23, all of the above-mentioned parts on the front surface of the module board 2 are mounted by the batchwise (simultaneous) solder reflowing.

Then, at step S24, the parts are mounted on the back surface of the module. Here, the parts are arranged on the back surface of the module board 2 by using the mounting machine in the same manner as on the front surface.

Then, at step S25, all of the above-mentioned parts on the back surface of the module board 2 are mounted by the batchwise (simultaneous) solder reflowing.

Thus, the memory-module 100 is fabricated mounting (in a mixed manner) predetermined numbers of WPPs 10 (of a number of 18×2), TSOPs 20 (of a number of 2), small surface-attached resistors 4 and EEPROM 5 on both the front and back surfaces of the module board 2.

Then, washing is effected at step S26.

Washing, however, may not be effected.

Then, at step S27, the module is tested. That is, the memory-module 100 is inspected in a predetermined manner to detect defective chips.

Then, at step S28, the defective chips are repaired and are exchanged. In this case, the solder is melted by being heated again, the defective chip (defective semiconductor device) is removed and is replaced by a non-defective chip (non-defective semiconductor device).

Then, at step S29, all parts are mounted by effecting the reflowing again.

Thereafter, washing is effected at step S30.

Washing, however, may not be effected.

Then, at step S31, the WPPs 10 are sealed by being underfilled with the resin. The underfilling is that when the WPP 10 has a relatively large chip size like DRAM and fails to exhibit a sufficient function for buffering stress to the bump electrodes 11, the resin 9 is applied between the package body 13 of the WPP 10 and the module body 2 to decrease the stress exerted on the bump electrodes 11.

That is, the underfilling is a sealing with resin between the package body 13 of the WPP 10 and the module board 2, in order to solidify and protect the surrounding of the bump electrode 11 with the resin 9.

To effect the underfilling, the liquid resin 9 is applied onto the module board 2 one surface by one surface from a nozzle 60a of a dispenser 60 shown in FIG. 10. That is, the resin 9 is applied onto the WPPs 10 on the front and back surfaces of the module board 2 one surface by one surface.

After the application has been finished on both surfaces, the front and back surfaces of the module board 2 are heated at one time to simultaneously cure the resin 9 on the front and back surfaces. That is, after the application of the resin 9 on both surfaces has been finished, the two surfaces are simultaneously cured (hardened) by baking by heating the atmosphere or by the like means.

Then, at step S32 as shown in FIG. 9, casing is effected, and the module is finally tested at step S33.

Predetermined data are written into the EEPROM 5 by using a special writer.

Thus, the assembling of the memory-module 100 shown in FIG. 1 is completed.

Here, mounting the bare chip that requires the same area as when the WPP 10 is mounted will be described for the purpose of comparing the two.

First, in mounting the bare chip, the bonding electrodes 1a are mounted on the mounting board without being rearranged by rewirings 12. Therefore, the pitch is narrow among the external terminals, the wiring rule becomes strict on the mounting board, and the cost of the mounting board is driven up. In assembling the module, further, it becomes necessary to add a mounting step by using a flip chip bonder of a relatively slow processing speed in addition to the step of mounting the SMD parts by reflowing the solder.

Accordingly, the WPPs 10 on the memory-module 100 of the embodiment 1 exhibit much effect in their mounting (decreases the number of the mounting steps since no special mounting device such as flip-chip bonder is used) than mounting the bare chips.

Next, described below is the underfilling method in the method of manufacturing the memory-module 100 of the embodiment 1.

FIG. 10 is a view illustrating a method of applying the resin for underfilling the WPPs 10 mounted on the memory-module 100 of FIG. 1, and FIG. 11 is a view illustrating the permeation of the resin 9 that is applied by the method of application shown in FIG. 10.

In FIG. 10, arrows indicate the direction in which the nozzle 60a travels. The dispenser 60 and the nozzle 60a move on the short sides of the WPPs 10 along the arrows.

According to the method of applying the resin of the embodiment 1, the dispenser 60 is moved intermittently and nearly linearly along the direction of short sides of the WPPs 10 having a rectangular shape on a plane, and the resin 9 is successively dripped on the short sides of the WPPs 10 from the upper side of the WPPs 10 through the nozzle 60a. That is, when the application on one WPP 10 has finished, the nozzle 60a is moved to an end on the front side of the short side of a next WPP 10, and the nozzle 60a is once stopped at this position.

Thereafter, the resin 9 is dripped while moving the nozzle 60a from the end of the front side of the short side of the WPP 10 toward the end of the rear side thereof and, at this position, motion of the nozzle 60a and dripping of the resin 9 are once halted.

Then, in a state where the resin 9 is no longer dripped, the nozzle 60a is moved to an end on the front side of the short side of the neighboring WPP 10, and the resin 9 is similarly dripped and, thus, the WPPs 10 are successively underfilled.

FIG. 11 illustrates the spreading of wet resin 9 that is applied by the method shown in FIG. 10 to the WPPs 10 of DRAMs in which the bump electrodes 11 are arranged in 15 rows×4 columns, wherein FIGS. 11A and 11B illustrate a state right after the resin is applied onto the short side, FIGS. 11C and 11D illustrate a state when a predetermined period of time (short time) has passed after the application, FIGS. 11E and 11F illustrate a state when a predetermined period of time (long time) has passed after the application, and FIGS. 11G and 11H illustrate a state where the resin 9 is applied by moving the nozzle 60a one turn to form a fillet 9a along the periphery after the predetermined period of time (long time) has passed after the application.

Referring to FIGS. 11E and 11F, it is also allowable to move again the dispenser 60 and the nozzle 60a about the package body 13 of the WPP 10 after the wet resin 9 has spread throughout between the WPP 10 and the module board 2 to reliably form the fillet 9a shown in FIG. 11G, so that the WPP 10 is secured to the module board 2 more strongly.

FIG. 12 illustrates the structure of a memory-module 200 which is modified from the memory-module 100 of the embodiment 1 of the invention.

The memory-module 200 includes 18 WPPs 10 (protruded terminal semiconductor devices) that are mounted being arranged in a sequence maintaining an equal pitch on one surface of the module board 2, and one TSOP 20 (lead terminal semiconductor device) mounted near the WPPs 10, the TSOP 20 (lead terminal semiconductor device) being arranged near the center of the WPPs 10 that are arranged in a sequence.

That is, a plurality of (10 and 8) WPPs 10 are arranged in a sequence on both sides of one TSOP 20.

Further, nine SOPs (small outline packages) 61 (registers 8) which are the lead terminal semiconductor devices are mounted on the module board 2 on the side of the connection terminals 2a which are the external terminals, and 18 WPPs 10 are mounted on the side opposite to the connection terminals 2a (on the side remote from the connection terminals 2a), the individual WPPs 10 being underfilled.

In the memory-module 200 of this type of mounting, the resin 9 for underfilling the WPPs 10 is applied nearly linearly onto the short sides of 18 WPPs 10 arranged in a sequence.

This makes it possible to efficiently apply the resin 9.

FIG. 13 illustrates the structure of a memory-module 300 which is modified from the memory-module 100 of the embodiment 1 of the invention.

In the memory-module 300 shown in FIG. 13, 18 WPPs 10 are mounted on the module board 2 in the form of groups (masses) each consisting of two or four in a two rows×two columns matrix arrangement.

Further, the individual WPPs 10 are mounted with their lengthwise direction in parallel with the direction of the short sides of the module board 2 of the memory-module 300.

Described here is a method of efficiently applying the resin 9 for underfilling the WPPs 10 in a state where the WPPs 10 are mounted.

When the temperature for applying the resin 9 is low, the resin 9 is applied to the package body 13 of the WPP 10 on the side of the long side, since the resin 9 may be infiltrated into between the package body 13 and the module board 2 over a short distance. This makes it possible to shorten the time for application.

It is therefore desired to maintain space for moving the nozzle 60a along the long sides of at least one side of the package bodies 13, and to arrange the long sides thereof of the side where no nozzle 60a moves as close to other parts as possible from the standpoint of highly densely mounting the parts.

When the semiconductor chip 1 has many bits and many DRAMs are connected to the same I/Os of the memory-module 300, a great advantage is obtained by applying the resin onto the DRAMs which are arranged as close as possible to each other in a 2×2 arrangement on the same plane.

With the WPPs 10 being arranged as shown in FIG. 13, therefore, it is desired to apply the resin 9 to the outer peripheries of the long sides of the outer side along the outer long sides of the WPPs 10. When the resin 9 is applied along the outer long sides of 2×2 DRAMs (WPPs 10) according to this method of application, the resin 9 does not flow onto the package bodies 13 to which the resin is not to be applied on the side opposite to the package bodies 13 to which the resin is to be applied. Or, the resin 9 does not leak or spread, either.

In the memory-module 300, it is desired that the WPPs 10 having I/O of (×4) constitution are collected in a number of four to obtain a 16-bit constitution, and are mounted as a group. In mounting the WPPs 10 as shown in FIG. 13, therefore, it is desired to apply the resin 9 along the locus as indicated by arrows.

FIG. 14 is a diagram illustrating the permeation of the resin 9 when it is applied according to a modified embodiment.

That is, in mounting the WPPs 10 on a memory-module 400 as shown in FIG. 15, the underfiller resin 9 is applied to the outer peripheries along the two opposing sides of the package bodies 13 as shown in FIG. 14. Here, the resin 9 is applied to both short sides of the WPPs 10 from the ends on one side to the ends on the opposite side.

Arrows shown in FIGS. 14A and 14B indicate the loci of motion of the dispenser 60. FIGS. 14C and 14D illustrate a state right after the application on both short sides (two sides), FIGS. 14E and 14F illustrate a state when a predetermined period of time (intermediate time) has passed after the application, and FIGS. 14G and 14H illustrate a state of infiltration of the resin 9 of when a predetermined period of time (long time) has passed after the application.

In the embodiment 1, the resin 9 permeated starting from both short sides is still in a separated state leaving an intermediate region where no resin 9 exists even in the final stage of infiltration of the resin 9. The difference in the thermal expansion between the package body 13 and the module board 2, and stress acting on the bump electrodes 11 due to the warping of the module board 2, increase with an increase in the distance from the center of the package body 13 and become a maximum at the bump electrodes 11 at the corners. Therefore, if the resin 9 is permeating near both short sides of the package body 13 of a rectangular shape, the stress acting on the bump electrodes 11 can be decreased to some extent even if there exists an intermediate region where the resin 9 is not existing.

Thus, the effect close to that of when the resin is applied to the whole surface of the package body 13 is obtained requiring a decreased amount of the resin 9 and a shortened operation time.

In other words, it is made possible to shorten the time for application and to decrease the amount of application.

Further, the resin 9 may simply be applied to the four corners of the package body 13. In this case, a decreased stress acts on the bump electrodes 11 arranged along the outermost circumference and, hence, the bump electrodes 11 feature extended life for connection.

FIGS. 15A and 15B illustrate the structure of a memory-module 400 modified from the memory-module 100, and in which 16 WPPs 10 are mounted in a sequence maintaining an equal pitch on one surface of the module board 2. In this memory-module 400, the underfiller resin 9 is linearly applied to 16 WPPs 10 arranged in a sequence. Arrows shown in FIG. 15A indicate the locus of motion of the dispenser 60 (see FIG. 10).

FIG. 16 illustrates a state where the memory-module 400 shown in FIG. 15 is deflected. This happens when the ends of the module board 2 are held at the time of inserting the socket for inspecting the memory-module 400.

That is, as shown in FIG. 16, when the memory-module 400 shown in FIG. 15 is deflected in the lengthwise direction thereof, the stress is nearly uniformly dispersed over the whole memory-module 400 since the memory-module 400 as a whole is deflected unless the sealing portions 14 of the neighboring WPPs 10 are integrally fabricated without coming into contact with each other.

This structure withstands the load from the outer side and, hence, improves the reliability of the memory-module 400.

In a memory-module 500 shown in FIGS. 17 and 18, the WPPs 10 of a number of 16 are mounted being divided into four regions each including four of them along the direction in which the plurality of connection terminals 2a are arranged on the module board 2, the sealing portion 14 continuing over the four WPPs 10 in each region.

That is, the WPPs 10 are mounted being divided into groups (masses), and are sealed by being underfilled as designated at the sealing portion 14 in a continuing manner with the group as a unit. Therefore, the portions of the groups (masses) of the memory-module 500 exhibit increased rigidity apparently including the WPPs 10.

Therefore, the bending stress of the module board 2 concentrates at the gaps among the groups of WPPs 10.

That is, the neighboring sealing portions 14 may often become continuous due to some factors affecting the application of the underfiller resin 9, such as gaps among the WPPs 10. Even in such a case, the memory-module 500 that includes the non-mounting portions 2b that are not partly continuous as shown in FIGS. 17 and 18, deflects at the non-mounting portions 2b when an external force is exerted, preventing the stress from being applied to the connection portions of bump electrodes 11 of the WPPs 10 or to the semiconductor chips 1.

Since the stress is dispersed, the WPPs 10 on the memory-module 500 feature improved reliability in the connection.

In the memory-modules 100, 200, 300, 400 and 500 of the embodiment 1, the WPPs 10 are sealed by underfilling, and the whole surfaces of the chips or the major portions are secured more strongly. As a result, shock resistance is improved and moisture resistance is improved, too.

In the module product, a TCP (tape carrier package) may be laminated as another means for highly densely mounting the parts. According to this technology, however, the chips are often cracked as their thickness is decreased. In the memory-modules 100, 200, 300, 400 and 500 according to the embodiment 1, on the other hand, shock resistance is improved by securing the chips relying on the underfilling, preventing the chips from being cracked.

Further, the WPPs 10 are sealed by underfilling and are mounted on the module board 2 with the main surfaces of the semiconductor chips 1 and the surfaces (back surfaces) of the opposite side being exposed. Moreover, the whole main surfaces or the main portions of the semiconductor chips 1 are secured to the module board 2 by being underfill-sealed, making it possible to decrease the heat resistance.

This helps improve the heat-radiating performance of the memory-modules 100, 200, 300, 400 and 500 and lengthen the life.

(Embodiment 2)

Figure 19:
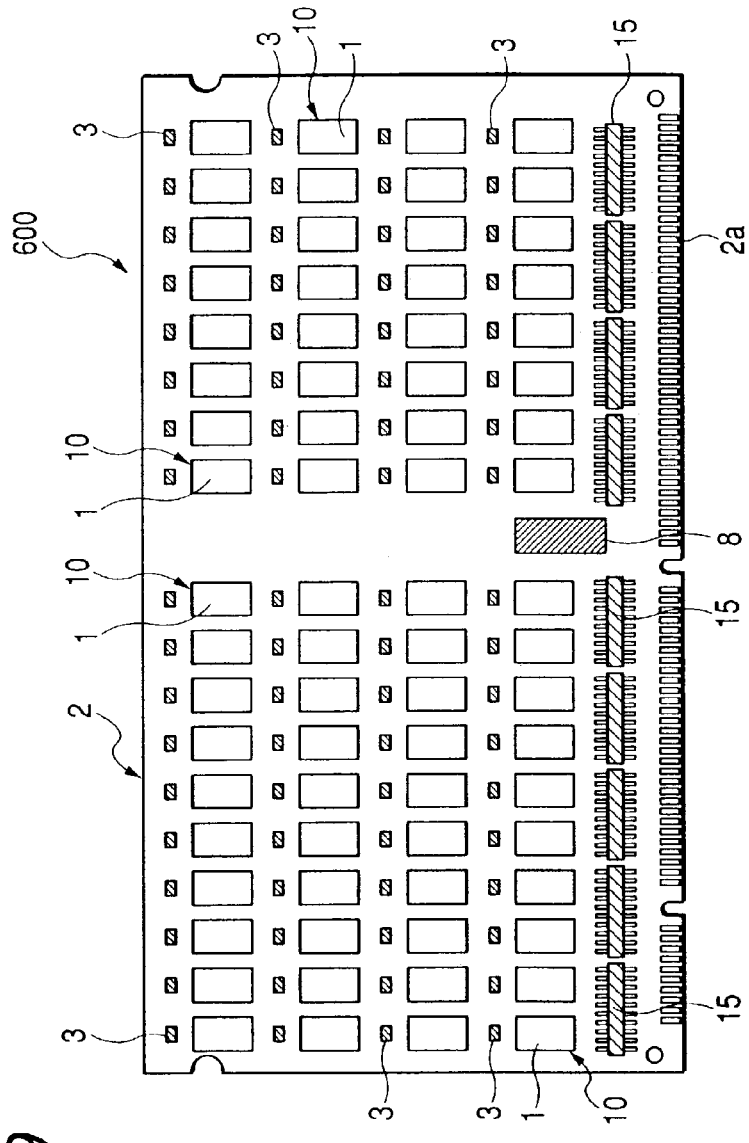
FIG. 19 is a plan view illustrating the structure of the memory-module according to an embodiment 2 of the present invention.

FIG. 19 is a plan view illustrating the structure of the memory-module according to an embodiment 2 of the present invention.

The memory-module 600 of the embodiment 2 includes 72 WPPs 10 (protruded terminal semiconductor devices) which are DRAMs mounted in a matrix arrangement. Connection of input/output signals to the WPPs 10 is accomplished in a manner that a group (mass) includes a total of 9 WPPs 10 consisting of one for ECC and eight of two rows (in the memory-module 600 of FIG. 19, the direction in parallel with the short sides of the module board 2 is referred to as row and the direction at right angles therewith is referred to as column, which, however, may be reversed to the above), and nine FET (field-effect transistor)—bus switches 15 (lead terminal semiconductor devices) which are memory selection means are mounted for the WPPs 10 of each of the groups to switch each of the groups.

That is, in the memory-module 600, the connection of input/output signals to nine WPPs 10 of two rows is switched within the group (8 WPPs) by a corresponding FET-bus switch 15, making it possible to increase the number of the WPPs 10 without increasing the number of the connection terminals 2a of the module board 2.

Therefore, the memory-module 600 mounts the WPPs 10 of a number four times as great as that of the memory-module 100 of the embodiment 1.

That is, the memory-module 600 separately switches the I/Os using the FET-bus switches 15, so that an increased number of DRAMs can be mounted.

In appearance, the FET-bus switches 15 of the memory-module 600 are, for example, those of the SOP type, which are lead terminal semiconductor devices.

The structure of the memory-module 600 of the embodiment 2 in other respects and the method of manufacturing the memory-module 600 are the same as those of the memory-module 100 of the embodiment 1, and are not described here again.

(Embodiment 3)

Figure 21:
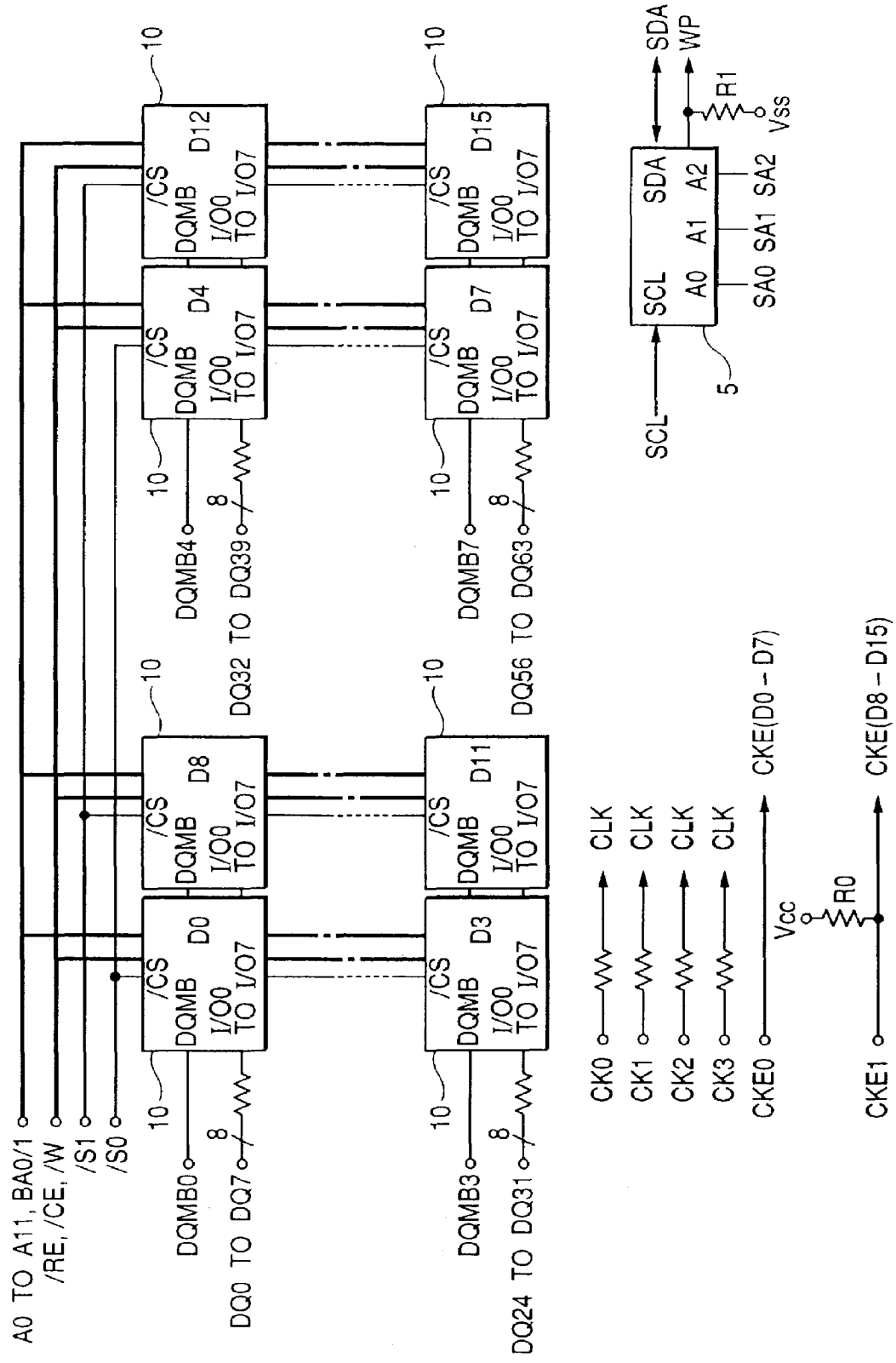
FIG. 21 is a diagram of block circuits of the memory-module shown in FIG. 20.
Figure 22:
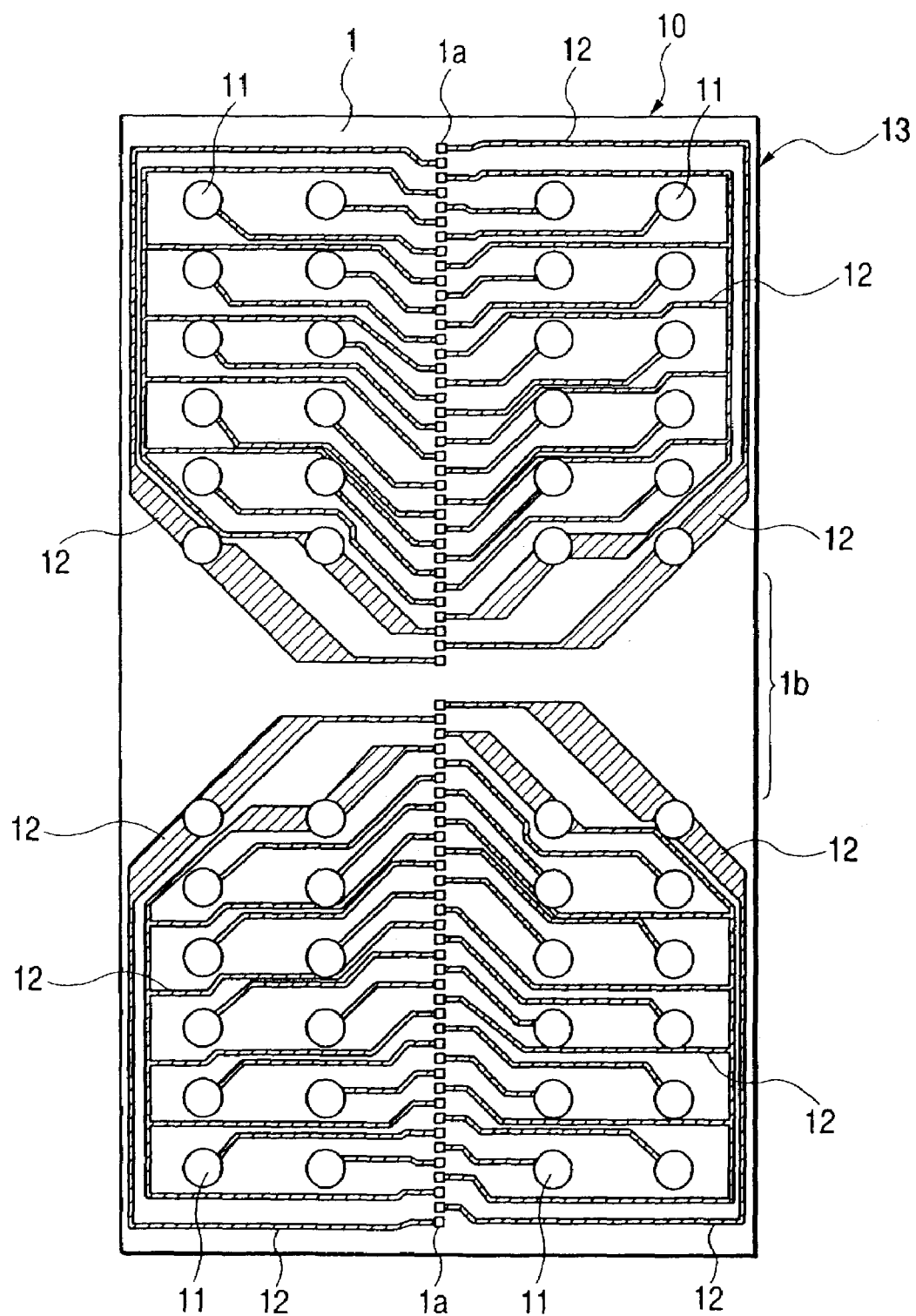
FIG. 22 is a bottom view illustrating the structure of a wafer process package (protruded terminal semiconductor device) mounted on the memory-module shown in FIG. 20.
Figure 23:
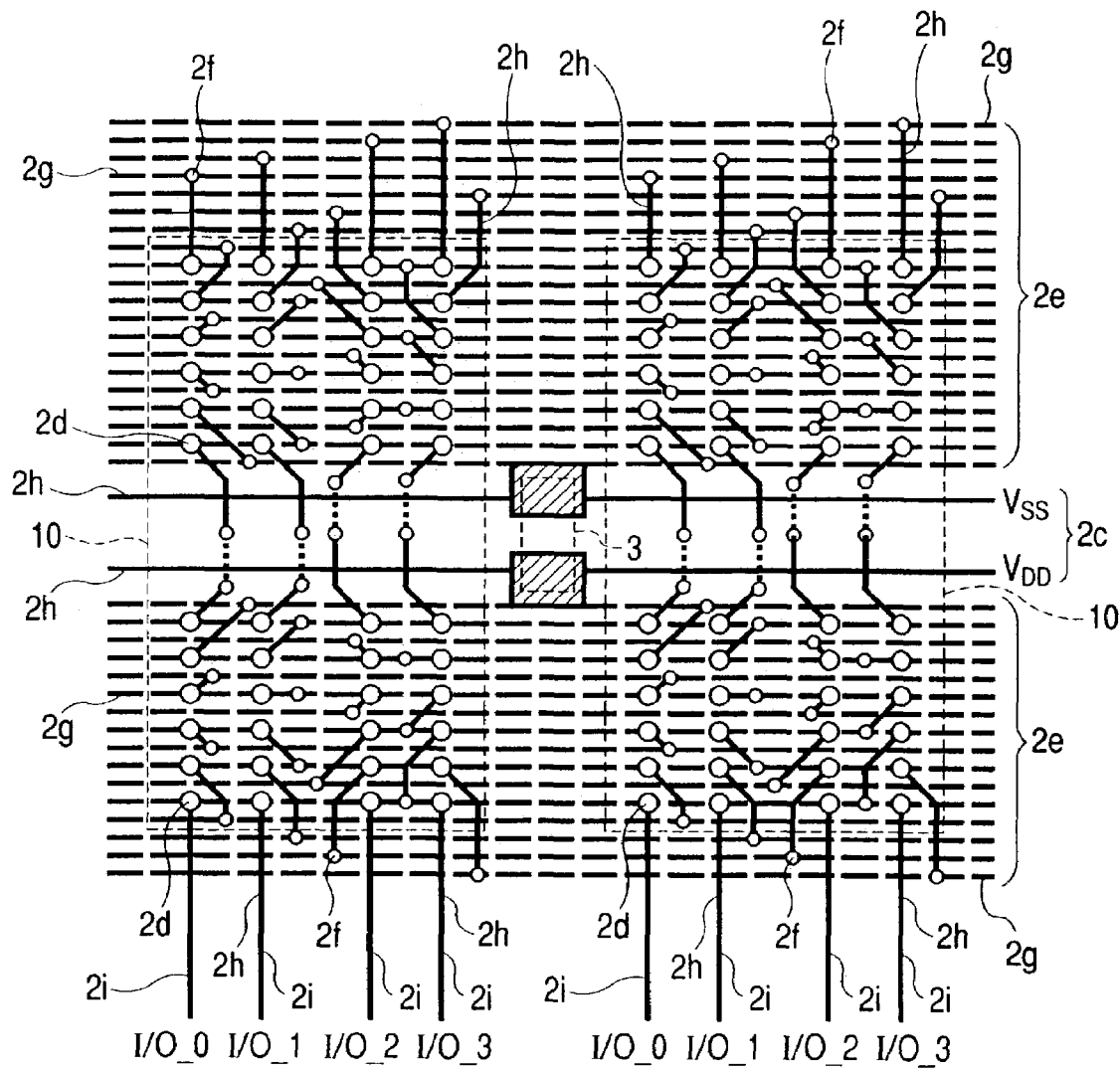
FIG. 23 is a diagram of wirings on the side of the board illustrating an example of wirings on the module board at a portion C in the memory-module shown in FIG. 20.
Figure 24:
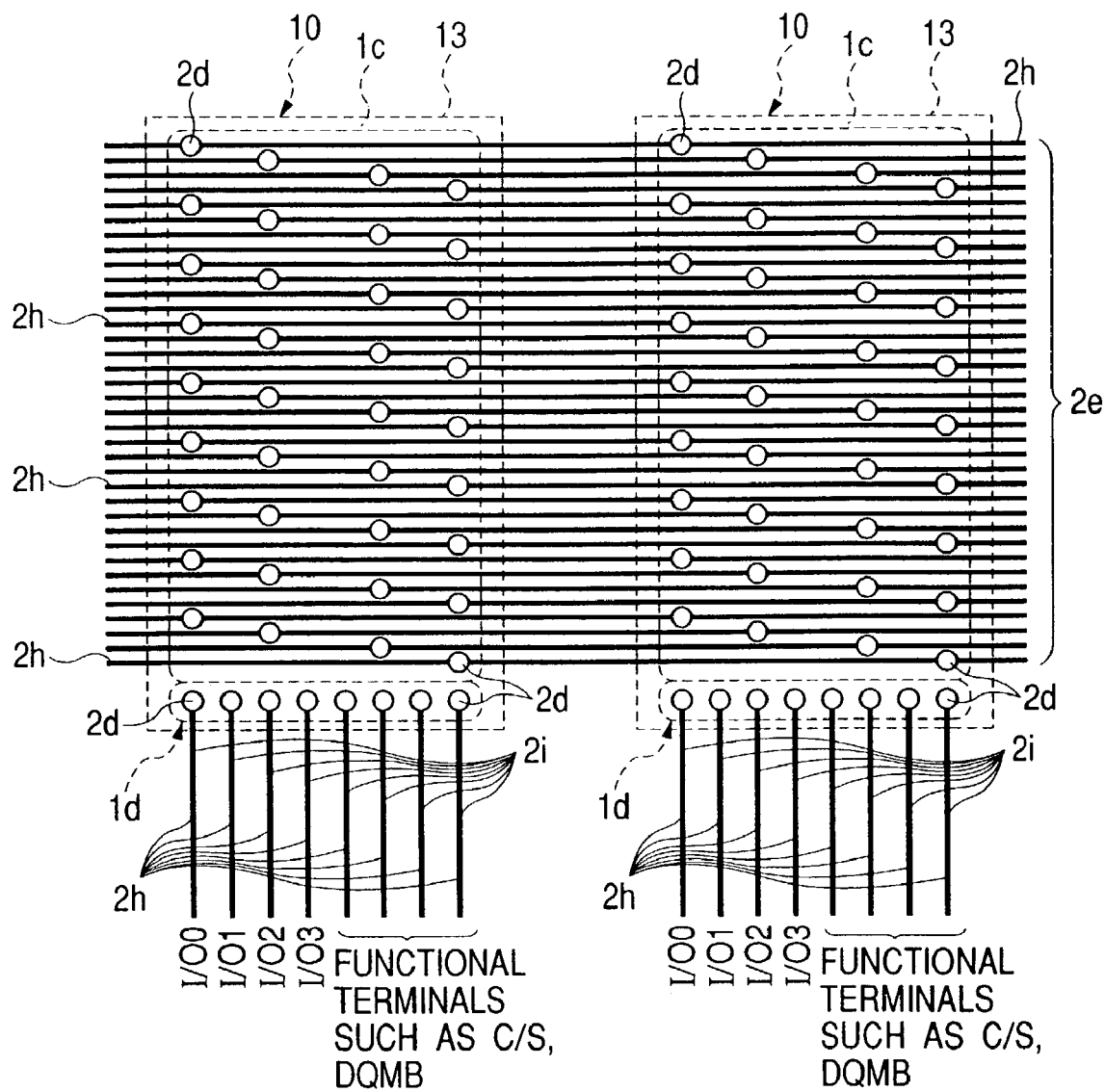
FIG. 24 is a diagram of wirings illustrating a modified example of the bump arrangement on the wafer process package in the memory-module according to the embodiment 3 of the invention and a modified example of the wirings on the side of the board corresponding thereto.
Figure 25:
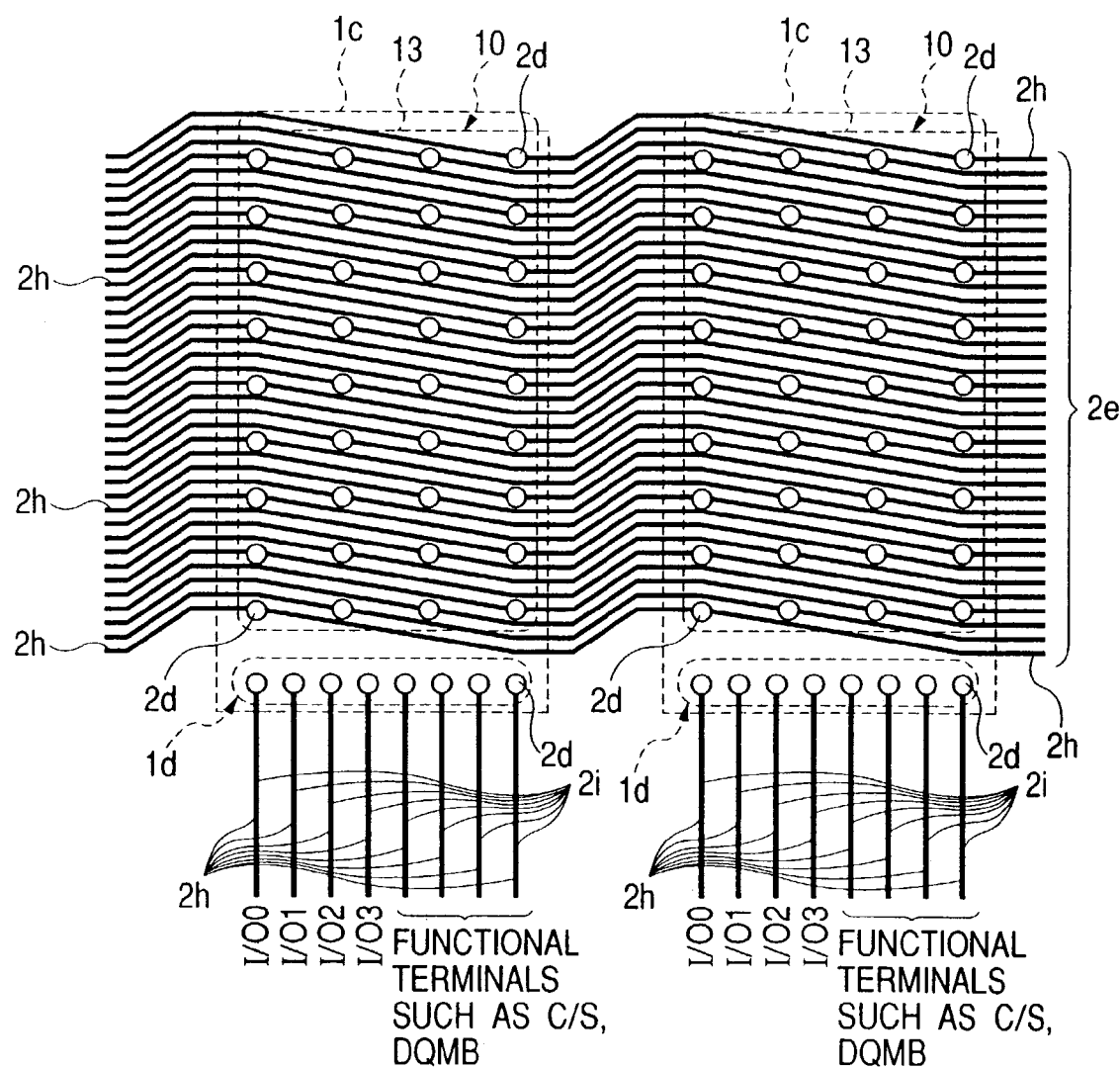
FIG. 25 is a diagram of wirings illustrating a modified example of the bump arrangement on the wafer process package in the memory-module according to the embodiment 3 of the invention and a modified example of the wirings on the side of the board corresponding thereto.
Figure 26:
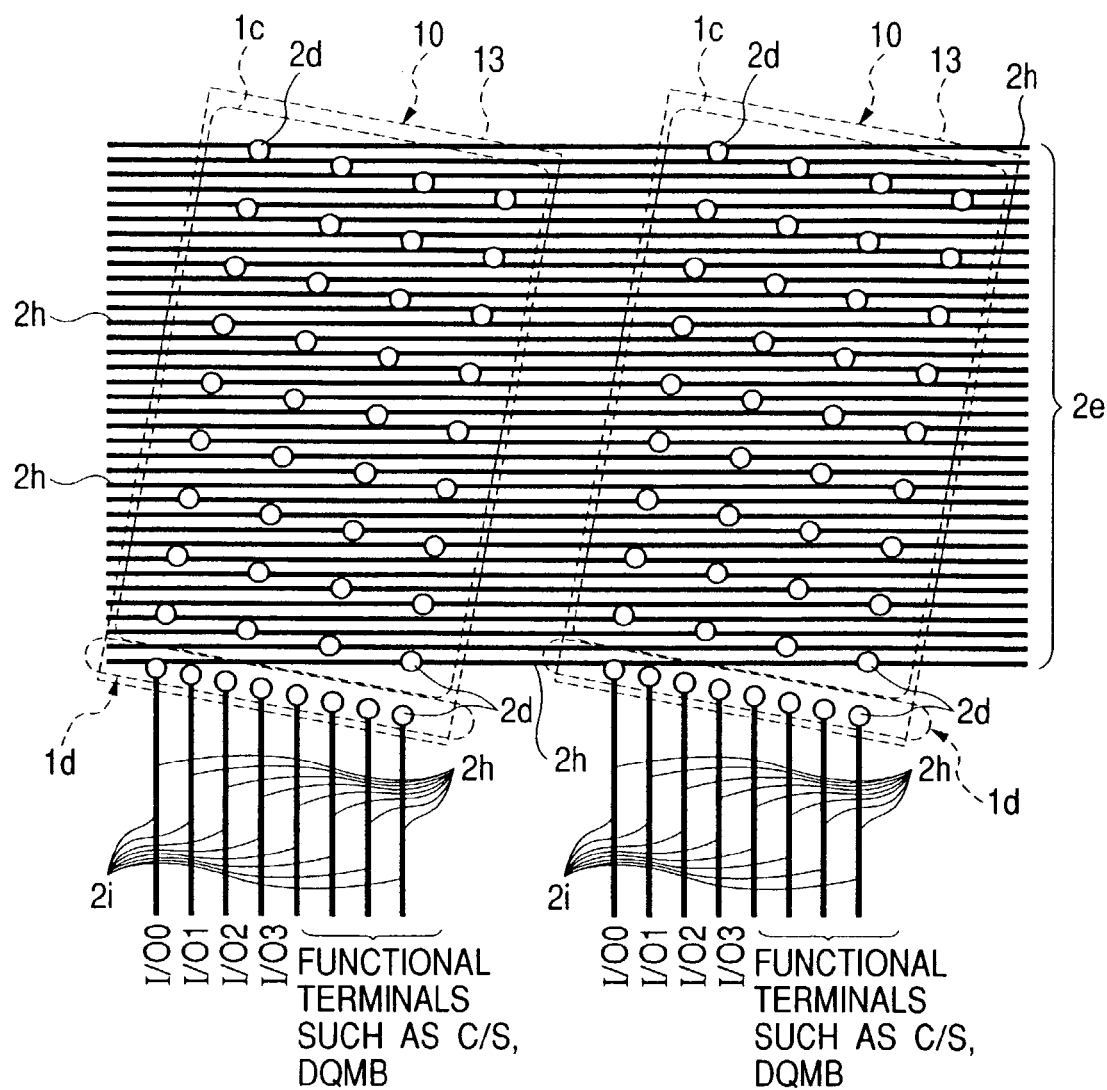
FIG. 26 is a diagram of wirings illustrating a modified example of the bump arrangement on the wafer process package in the memory-module according to the embodiment 3 of the invention and a modified example of the wirings on the side of the board corresponding thereto.
Figure 27:
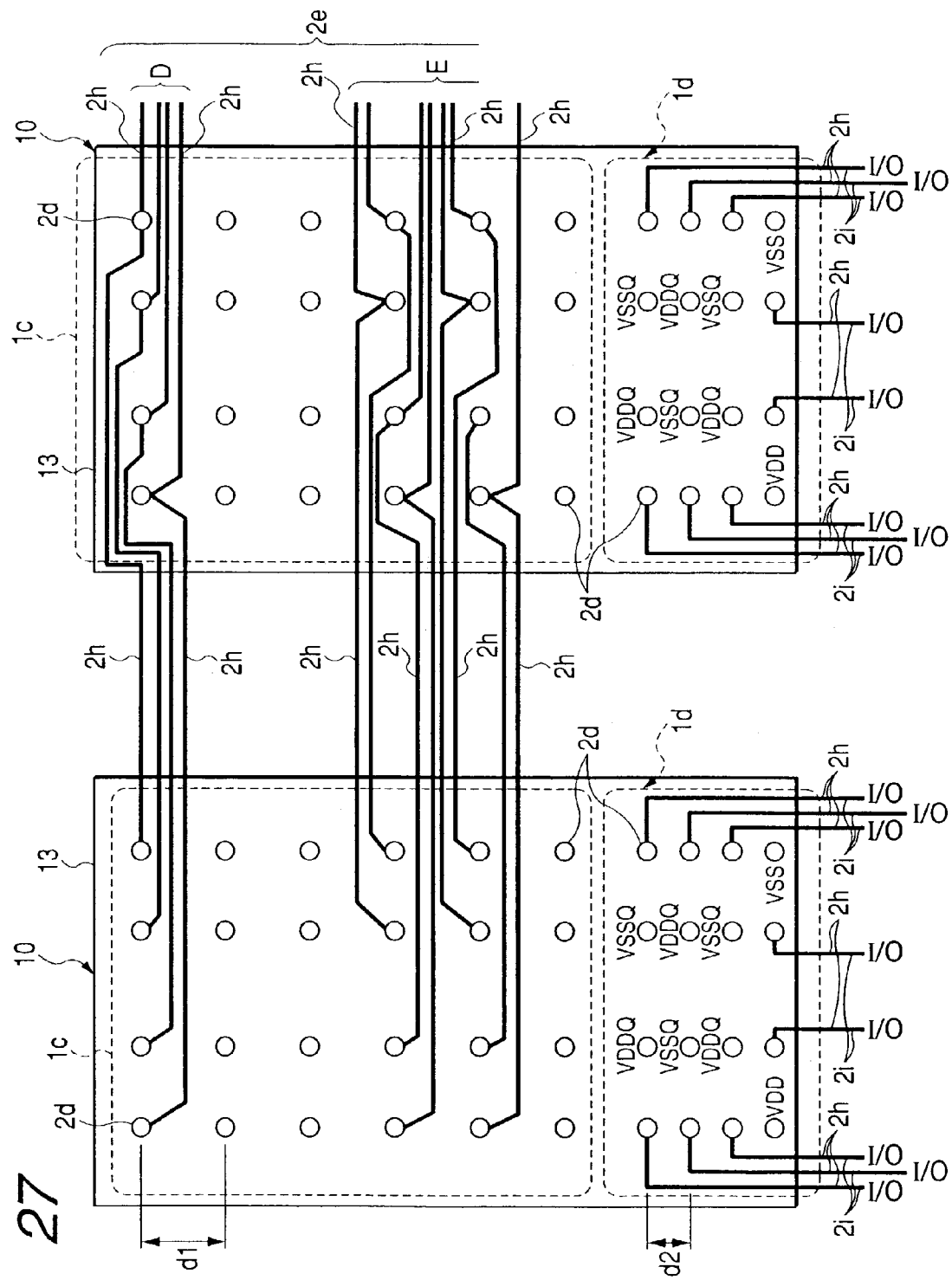
FIG. 27 is a diagram of bump arrangement and wirings illustrating a further modified example of the bump arrangement on the wafer process package and of the wirings on the side of the board shown in FIG. 25.

FIG. 20 is a view illustrating the structure of a memory-module according to an embodiment 3 of the present invention, wherein FIG. 20A is a plan view and FIG. 20B is a side view, FIG. 21 is a diagram of block circuits of the memory-module shown in FIG. 20, FIG. 22 is a bottom view illustrating the structure of a wafer process package (protruded terminal semiconductor device) mounted on the memory-module shown in FIG. 20, FIG. 23 is a diagram of wirings on the side of the board illustrating an example of wirings on the module board at a portion C in the memory-module shown in FIG. 20A, FIGS. 24, 25 and 26 are diagrams of wirings illustrating modified examples of the bump arrangement on the wafer process package in the memory-module according to the embodiment 3 of the invention and modified examples of the wirings on the side of the board corresponding thereto, and FIG. 27 is a diagram of bump arrangement and wirings illustrating a further modified example of the bump arrangement on the wafer process package and of the wirings on the side of the board shown in FIG. 25.

The memory-module 700 of the embodiment 3 shown in FIGS. 20A and 20B is an unbuffered SDRAM (static DRAM)—DIMM (dual in-line memory-module) of 8 bytes having 168 pins, and includes 8 WPPs 10 (protruded terminal semiconductor devices), small surface-attached resistors 4, capacitors 3 and an EEPROM 5 that are mounted in a mixed manner on one surface thereof.

The memory-module 700, however, does not mount the registers 8 that are mounted on the memory-module 100 of FIG. 1.

FIG. 21 is a diagram of block circuits of the memory-module 700 shown in FIG. 20, constituting two banks.

Symbols attached to the terminals shown in FIG. 21 are the same as those described with reference to the block circuit diagram of the memory-module 100 of the embodiment 1, and are not described here again.

In the memory-module 700 shown in FIG. 21, whether the S0 system of the bank 1 or the S1 system of the bank 2 be read out, is directly determined by a signal since no register 8 has been mounted. That is, since the memory-module is of the unbuffered type, a signal directly enters either bank to select a semiconductor chip 1 of either bank.

The chips D0 to D15 represent WPPs 10 of a number of 16 on both surfaces, and [I/O 0 to I/O 3] terminals of each chip are connected as independent terminals to the connection terminals 2a of the module board 2.

The DRAMs as a whole have I/Os of 64 bits from DQ0 to DQ63 that are used as data, constituting two banks.

The memory-module 700 shown in FIG. 20 is inexpensive compared to the memory-module 100 shown in FIG. 1.

The module board 2 of the memory-module 700 has a size of, for example, P=133.35 mm and Q=33.02 mm, and the mounting height (max) is R=4 mm as shown in FIG. 20B.

Referring to FIG. 20A, the memory-module 700 includes 8 WPPs 10 (protruded terminal semiconductor devices) which are DRAMs arranged in a sequence on one surface thereof, as well as capacitors 3 at portions among the neighboring WPPs 10 or by the WPPs 10 nearly at the centers in the lengthwise direction.

This is to minimize the wiring length between the WPPs 10 and the capacitors 3.

Here, FIG. 22 illustrates the structure of the WPP 10 used for the memory-module 700.

In the semiconductor chip 1 of WPP 10 shown in FIG. 22, a free space 1b without bump electrode 11 is formed near the center in the lengthwise direction thereof.

This is done by partly changing the pitch among the bump electrodes 11 by rewirings 12 so as to form the free space 1b, i.e., to form the free space 1b without bump electrode 11 near the center of the WPP 10 in the lengthwise direction thereof.

FIG. 23 illustrates the wirings on the side of the module board 2 at the portion C in FIG. 20A.

Referring to FIGS. 22 and 23, the capacitor 3 (lead terminal semiconductor device) is mounted neighboring the free space 1b of the semiconductor chip 1, and power source wirings 2c of the capacitor 3 are formed as surface-layer wirings 2h on the surface layer opposing the free space 1b of the semiconductor chip 1 on the module board 2 (they, however, may be formed as inner-layer wirings 2g in the inner layer).

That is, as shown in FIG. 22, the free space 1*b* without bump electrode 11 is formed near the center of the semiconductor chip 1 in the lengthwise direction thereof. Therefore, the connection can be accomplished without drawing the signal lines of the WPP 10 to the portions corresponding to the center of the chip on the module board 2 and, hence, the capacitor 3 can be mounted at a portion closest to the WPP 10.

Accordingly, the wirings become the shortest between the WPPs 10 and the capacitors 3 to improve the operation characteristics.

Referring to FIG. 23, the module board 2 is formed by a total of six metal layers including two core layers Vcc, a GND layer, and two signal line layers on each surface. Common wirings 2*e* of the address/functional system connect the lands 2*d* on the surface layer to which the bump electrodes 11 of the WPP 10 are connected, to the layer which is just thereunder through via-holes 2*f*, and are connected to the inner-layer wirings 2*g* that extend in the lengthwise direction of the module board 2.

The I/O wirings are connected to the connection terminals 2*a* disposed nearby through the surface-layer wirings 2*h* of the module board 2. This suppresses an increase in the inductance that results when the via-holes 2*f* are passed through.

In the wirings shown in FIG. 23, the Vss (GND) and Vdd are extending sideways from the capacitor 3, which, however, may be readily connected to the core layers through via-holes 2*f*.

FIGS. 24, 25 and 26 are diagrams illustrating modified examples of the bump arrangement of the WPP 10 in the memory-module 700 of the embodiment 3 and modified examples of the wirings on the side of the board corresponding thereto, and FIG. 27 illustrates a further modified example of the bump arrangement of the wafer process package shown in FIG. 25 and of the wirings on the side of the board.

In the WPPs 10 in FIGS. 24, 25, 26 and 27, there are separately provided a group of common bump electrodes (group of common protruded terminals) 1*c* which is a group of common electrodes such as of addresses, functions, power source and GND that can be connected in common among the WPPs 10, and a group of independent bump electrodes (group of independent protruded terminals) 1*d* that is a group of independent electrodes such as of I/Os independently connected for each of the WPPs 10.

In the WPP 10, further, the group of independent bump electrodes 1*d* is arranged at an end on one side which is the short side of the package body 13. On one surface of the memory-module 700, eight WPPs 10 are mounted with their groups of independent bump electrodes 1*d* being directed to the side of the connection terminals 2*a* of the module board 2.

On the module board 2 are therefore formed surface-layer wirings 2*h* which are common wirings 2*e* for connecting the groups of common bump electrodes 1*c* of eight WPPs 10.

Here, the pitch is broadened among the group of common bump electrodes 1*c*, i.e., among the bump electrodes 11 of the address system and functional system. In particular, the pitch is expanded in the lengthwise direction of the chip so that many wirings can be formed in the direction at right angles with the lengthwise direction of the package body 13 passing among the bump electrodes.

Further, the pitch is decreased among the group of independent bump electrodes 1*d*, i.e., among the bump electrodes 11 of the I/O system, and the bump electrodes are arranged in the outer periphery on one side of the package body 13.

This makes it possible to form common wirings 2*e* relying on the surface-layer wirings 2*h* only and, hence, to decrease the number of the wiring layers in the module board 2.

In the WPPs 10 shown in FIG. 24, the groups of common bump electrodes 1*c* are regularly arranged by rewirings 12 being inclined with respect to the package bodies 13.

This makes it possible to form the plurality of common wirings 2*e* in parallel in the lengthwise direction of the package bodies 13 to connect common electrodes such as of addresses, functions, power source and GND.

As a result, the wiring density of the module board 2 can be maximized and the lengths of the common wirings 2*e* can be minimized.

When the number of the bump electrodes 11 of the WPP 10 is relatively small compared to its chip size or when the module board 2 involves fine wiring rules like an additive board, the GND and Vcc layers of the surface layer and of the inner layer are partly used as signal layers to produce the module board 2 of four layers and, hence, to assemble the memory-module 700 by using this module board 2.

In this case, the independent wirings 2*i* of the I/O system are connected from the bump electrodes 11 provided on the side of the connection terminals 2*a*, and the plurality of common wirings 2*e* connecting the common electrodes such as of addresses, functions, power source and GND are so formed as to pass among the chips.

In the WPPs 10 as shown in FIG. 25, further, the groups of common bump electrodes 1*c* are arranged like a grid using rewirings 12 (see FIG. 22). In this case, as shown in FIG. 22, the rewirings 12 are used for distributing the power source and GND wirings in the chip, and one bump electrode 11 is electrically connected to a plurality of bonding electrodes 1*a* through the rewirings 12 to decrease the number of the bump electrodes 11 (to decrease the number of the external terminals).

In the wirings on the side of the board shown in FIG. 25, the connection is made using the surface layer only of the module board 2, and the bump electrodes 11 are arranged without being inclined. Therefore, the wirings are accomplished by utilizing the bending and inclination of the wirings on the side of the board.

In the WPPs 10 shown in FIG. 26, the pitch among the bump electrodes 11 is slightly expanded to be larger than that of the bump arrangement of the WPPs 10 shown in FIG. 25, and the bump electrodes are arranged on the module board 2 being inclined in the lengthwise direction or in the direction of the short side.

Therefore, the common wirings 2*e* on the side of the module board 2 are inclined relative to the lengthwise direction of the package bodies 13. As a result, the common wirings 2*e* are formed straight like the common wirings 2*e* shown in FIG. 24.

FIG. 27 illustrates a further modified example in which the pitch among the bump electrodes 11 is slightly expanded to be larger than that of the bump arrangement of the WPPs 10 shown in FIG. 25. In this modified example, independent pins other than those of the I/O system are drawn out from the lower side. This is an example in which the bits are specially constituted to decrease the number of pins to thereby increase the gap among the common wirings 2*e*, the I/O pins and other independent pins having a narrow pitch (d1>d2 in FIG. 27).

The modified example shown in FIG. 27 exhibits such an effect that an increased number of wirings can be drawn among the pins since the gap is broadened among the common wirings. Therefore, the wirings on the module board 2 can be used in common using the surface-layer wirings 2h only, without using the inner-layer wirings 2g (see FIG. 23) of the module board 2. The I/O pins and independent pins such as of the power source have a narrow pitch. These pins may have a narrow pitch since the wirings are drawn downward, i.e., drawn to the connection terminals 2a without passing among the pins.

In FIG. 27, three surface-layer wirings 2h run between the pins when the wiring layout D is employed, and four surface-layer wirings 2h run between the pins when the wiring layout E is employed.

In FIGS. 24, 25, 26 and 27, the mounting lands are not particularly indicated on the module board 2 and the slit-like openings in the resist at right angles with the common wirings 2e are regarded to be false lands for connection by soldering, in order to increase the wiring density on the module board 2 up to its limit.

The structure of the memory-module 700 of the embodiment 3 in other respects and the method of manufacturing the memory-module 700 are the same as those of the memory-module 100 of the embodiment 1, and are not described here again.

In the foregoing was concretely described the invention accomplished by the present inventors by way of embodiments. However, the present invention is in no way limited to the above-mentioned embodiments only but can be modified in a variety of ways without departing from the spirit and scope of the invention.

In the memory-modules 100 to 700 of the above-mentioned embodiments 1, 2 and 3, for example, the EEPROM 5 was the lead terminal semiconductor device having outer leads 21. However, the EEPROM 5 which is a nonvolatile read-only memory may be formed in the same structure as the protruded terminal semiconductor device, i.e., as the WPP 10, and may be mounted.

In this case, however, the EEPROM 5 of the WPP structure is not sealed by underfilling but the WPPs 10 which are the DRAMs only are underfilled.

That is, the EEPROM 5 of the WPP structure is detachably mounted on the module board 2.

This is because the EEPROM 5 is produced maintaining a low yield and when it is detected to be defective upon electrically writing data therein, the EEPROM 5 is better replaced by a non-defective one. The EEPROM 5 has a small chip size compared to the DRAM, causes small stress to exert on the bump electrodes 11, and maintains reliability to a sufficient degree even without being underfilled. Upon mounting the EEPROM 5 of the WPP structure, the mounting area can be decreased compared to when the SOP type device is mounted and the cost can be decreased to be lower than that of the SOP type device.

The above-mentioned embodiments 1, 2 and 3 have dealt with the memory-modules of the type mounting the WPPs 10 on both the front and back surfaces of the module board 2. However, the memory-module may be the one of the type mounting the WPPs 10 on one surface only.

The lead terminal semiconductor device mounted together with the WPPs 10 (protruded terminal semiconductor devices) is not limited to TSOP 20 but may be such a semiconductor device as QFP (quad flat package) or TCP (tape carrier package) in addition to TSOP 20.

The above-mentioned embodiments 1, 2 and 3 have dealt with the case where the protruded terminal semiconductor devices are the WPPs 10. However, the protruded terminal semiconductor devices may be any other semiconductor devices provided their external terminals are bump electrodes 11 and are equipped with wiring portions for expanding the pitch among the bonding electrodes 1a of the semiconductor chips 1 to be wider than the pitch among the bump electrodes 11.

FIGS. 28, 29 and 30 illustrate modified examples of the protruded terminal semiconductor device other than the WPP 10.

Figure 28A:
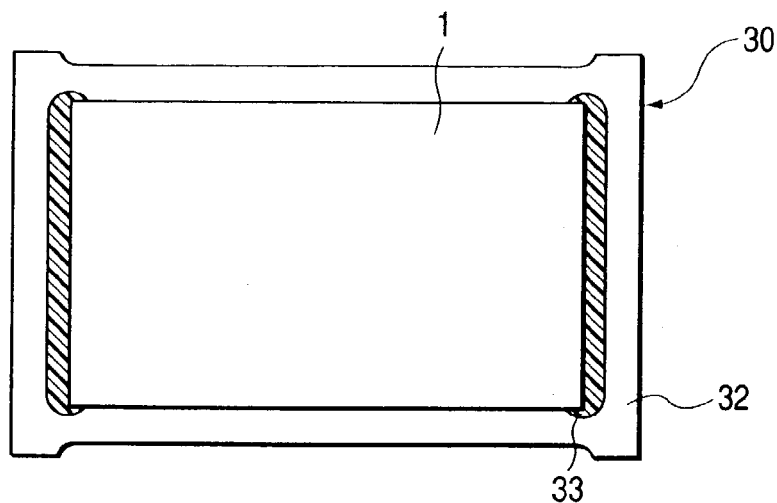
Figure 28B:
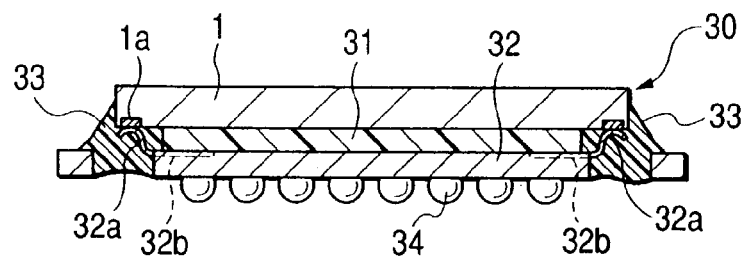
Figure 28C:
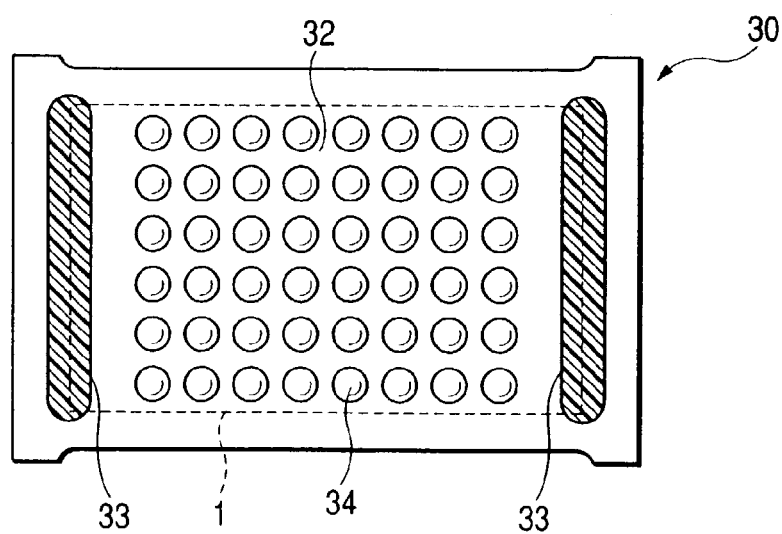

FIGS. 28A, 28B and 28C illustrate a CSP (chip scale package) 30 as a modified example of the protruded terminal semiconductor device.

The CSP 30 has a chip size nearly equal to, or slightly larger than, the semiconductor chip 1, and is of the fan in structure that supports the semiconductor chip 1 by a tape board 32 by interposing an elastomer 31.

Further, a plurality of bump electrodes 34 (protruded terminals) of solder or the like are formed as external terminals within an area of the semiconductor chip 1, the connection leads 32a provided on the tape board 32 are electrically connected to the bonding electrodes 1a of the semiconductor chip 1, and terminal pitch-expanding wirings 32b are formed on the tape board 32 to expand the pitch among the bump electrodes 34 to be wider than the pitch among the bonding electrodes 1a of the semiconductor chip 1.

A sealing portion 33 is formed on the bonding electrodes 1a of the semiconductor chip 1.

FIGS. 29A and 29B illustrate a BGA (ball grid array) 40 of the chip face-up mounting system as a modified example of the protruded terminal semiconductor device.

The BGA 40 is the one in which the semiconductor chip 1 is secured to a BGA board 42 in a face-up manner through a die-bonding material 45, and the bonding electrodes 1a of the semiconductor chip 1 are electrically connected to the board electrodes 42f of the BGA board 42 through bonding wires 41 of gold or the like material.

Further, a plurality of bump electrodes 44 (protruded terminals) of solder or the like material are arranged as external terminals like a grid on the back surface of the BGA board 42, and terminal pitch-expanding wirings 42a are formed on the BGA board 42 to expand the pitch among the bump electrodes 44 to be wider than the pitch among the bonding electrodes 1a of the semiconductor chip 1.

The terminal pitch-expanding wirings 42a include signal wirings 42b, GND plane 42c, Vdd plane 42d and through holes 42e.

Further, a molded portion 43 is formed for sealing the semiconductor chip 1 and the bonding wires 41 with a resin.

FIGS. 30A, 30B and 30C illustrate a BGA (ball grid array) 50 of the chip face-down mounting system as a modified example of the protruded terminal semiconductor device.

The BGA 50 is of the flip-chip structure in which the semiconductor chip 1 is mounted on the BGA board 52 in a face-down manner via small bumps 51, and the bonding electrodes 1a of the semiconductor chip 1 are electrically connected to the electrodes of the BGA board 52 through the small bumps 51.

Further, the bump electrodes 54 (protruded terminals) of solder or the like material are arranged as external terminals like a grid on the back surface of the BGA board 52, and terminal pitch-expanding wirings 52a (see FIG. 30C) are formed on the BGA board 52 to expand the pitch among the bump electrodes 54 to be wider than the pitch among the bonding electrodes 1a (see FIG. 29) of the semiconductor chip 1.

A gap between the semiconductor chip 1 and the BGA board 52, i.e., the periphery of the small bumps 51, is underfilled with a resin to form a sealed portion 53.

In the CSP 30 shown in FIG. 28, BGA 40 shown in FIG. 29 and BGA 50 shown in FIG. 30, too, the terminal pitch-expanding wirings 32b, 42a and 52a are provided, respectively, to expand the pitch among the bump electrodes 34, 44, 54 to be wider than the pitch among the bonding electrodes 1a of the semiconductor chip 1, which, therefore, can be mounted by reflowing on the module board 2 or the like.

Briefly described below are the advantages obtained by the representative examples of the inventions disclosed in this application.

(1) Upon mounting the protruded terminal semiconductor devices on the module board of the memory-module, it becomes possible to greatly decrease the mounting areas compared to mounting the lead terminal semiconductor devices having semiconductor chips that are individually treated. This makes it possible to effect the mounting requiring the least areas so far as the semiconductor chips are mounted and, hence, to greatly increase the module capacity.

(2) The WPPs are mounted as the protruded terminal semiconductor devices while expanding the pitch among the bump electrodes which are the external terminals to be wider than the pitch among those of the flip chips, making it possible to expand the wiring rules on the module board and, hence, to realize a highly densely mounted memory-module suppressing the cost.

(3) The bonding electrodes of the semiconductor chip can be connected to the bump electrodes which are the external terminals of the WPPs through wirings of lengths shorter than those of the SMD parts such as TSOPs. This enables the memory-module to cope with high-speed operations and, hence, to cope with high-speed buses.

(4) Since the WPPs in the memory-module are sealed by underfilling, the whole chip surfaces are strongly secured to exhibit improved shock resistance. Therefore, the chips are prevented from being cracked.

(5) The WPPs are sealed by underfilling and are mounted on the module board in a state where the back surfaces of the semiconductor chips are exposed and, besides, the whole main surfaces of the semiconductor chips are secured to the module board by underfill-sealing, enabling the heat resistance of the memory-module to be decreased. As a result, the memory-module exhibits improved heat-radiating performance and extended life.

What is claimed is:

1. A memory-module comprising;
protruded terminal semiconductor devices each having a semiconductor chip, bump electrodes as external terminals, and wiring portions for expanding pitches among the bump electrodes to be wider than pitches among bonding electrodes formed on the semiconductor chip;
a lead terminal semiconductor device having outer leads as external terminals; and
a module board supporting the protruded terminal semiconductor devices and the lead terminal semiconductor device,
wherein the protruded terminal semiconductor devices are mounted via the bump electrodes on the module board and the lead terminal semiconductor device is mounted via the outer leads on the module board,
wherein the protruded terminal semiconductor devices include DRAMs,
wherein the protruded terminal semiconductor devices are arranged in a line along a lengthwise direction of the module board, wherein the lead terminal semiconductor device includes a PLL or a register, and
wherein the lead terminal semiconductor device is arranged among the protruded terminal semiconductor devices.

2. A memory-module according to claim 1,
wherein the protruded terminal semiconductor devices are arranged in a sequence on both sides of the lead terminal semiconductor device on one surface of the module board.

3. A memory-module according to claim 1,
wherein each of the protruded terminal semiconductor devices has a rectangular shape on a plane, and
wherein the protruded terminal semiconductor devices are arranged such that a short side of each of the protruded terminal semiconductor devices is opposite a long side of the module board.

4. A memory-module according to claim 1,
wherein a size of each of the protruded terminal semiconductor devices is smaller than that of the lead terminal semiconductor device.

5. A memory-module according to claim 1,
wherein the lead terminal semiconductor device has a rectangular shape on a plane, and
wherein the lead terminal semiconductor device is arranged such that a short side of the lead terminal semiconductor devices is opposite a long side of the module board.

6. A memory-module according to claim 1,
further comprising a plurality of said lead terminal semiconductor devices,
wherein each of the lead terminal semiconductor devices has a rectangular shape on a plane, and
wherein the lead terminal semiconductor devices are arranged such that a long side of each of the lead terminal semiconductor devices is opposite a long side of the module board.

7. A memory-module according to claim 6,
wherein a part of each of the lead terminal semiconductor devices is off the line of the protruded terminal semiconductor devices.

8. A memory-module according to claim 1,
wherein the wiring portions are rewirings in an area of the semiconductor chip.

9. A memory-module comprising:
protruded terminal semiconductor devices each having a semiconductor chip, bump electrodes as external terminals and wiring portions for expanding pitches among the bump electrodes to be wider than pitches among bonding electrodes formed on the semiconductor chip;
a lead terminal semiconductor device having outer leads as external terminals; and
a module board supporting the protruded terminal semiconductor devices and the lead terminal semiconductor device,
wherein the protruded terminal semiconductor devices are mounted via the bump electrodes on the module board and the lead terminal semiconductor device is mounted via the outer leads on the module board, wherein the protruded terminal semiconductor devices include DRAMs, wherein the protruded terminal semiconductor devices are arranged in a line along a lengthwise direction of the module board wherein the lead terminal semiconductor device includes a PLL or a register, and wherein the lead terminal semiconductor device is off the line of the protruded terminal semiconductor devices.

10. A memory-module according to claim 9, wherein a size of the lead terminal semiconductor device is smaller than that of each of the protruded terminal semiconductor devices.

11. A memory-module according to claim 9, wherein the outer leads serving as the external terminals of the lead terminal semiconductor device are arranged protruding in a direction perpendicular to the lengthwise direction.

12. A memory-module according to claim 9, wherein each of the protruded terminal semiconductor devices has a rectangular shape on a plane, and wherein the protruded terminal semiconductor devices are arranged such that a short side of each of the protruded terminal semiconductor devices is opposite a long side of the module board.

13. A memory-module according to claim 9, wherein the wiring portions are rewirings in an area of the semiconductor chip.

14. A memory-module comprising:

protruded terminal semiconductor devices each having a semiconductor chip, bump electrodes as external terminals, and wiring portions for expanding pitches among the bump electrodes to be wider than pitches among bonding electrodes formed on the semiconductor chip;

lead terminal semiconductor devices having outer leads as external terminals; and a module board supporting the protruded terminal semiconductor devices and the lead terminal semiconductor devices, wherein the protruded terminal semiconductor devices are mounted via the bump electrodes on the module board and the lead terminal semiconductor devices are mounted via the outer leads on the module board, wherein the protruded terminal semiconductor devices include DRAMs, wherein each of the protruded terminal semiconductor devices has a rectangular shape on a plane, wherein the protruded terminal semiconductor devices are arranged in a line along a lengthwise direction of the module board and along a direction of a short side of each of the protruded terminal semiconductor devices, wherein each of the lead terminal semiconductor devices has a rectangular shape on a plane, wherein the lead terminal semiconductor device includes a PLL or a register, and wherein the lead terminal semiconductor devices are arranged such that a long side of each of the lead terminal semiconductor devices is opposite a long side of the module board.

15. A memory-module according to claim 14, wherein the protruded terminal semiconductor devices are arranged in a sequence on both sides of the lead terminal semiconductor devices on one surface of the module board.

16. A memory-module according to claim 14, wherein a part of each of the lead terminal semiconductor devices is off the line of the protruded terminal semiconductor devices.

17. A memory-module according to claim 14, wherein the wiring portions are rewirings in an area of the semiconductor chip.

* * * * *